United States Patent
Baron et al.

(10) Patent No.: US 9,607,362 B2
(45) Date of Patent: Mar. 28, 2017

(54) COMPRESSIVE IMAGING USING APPROXIMATE MESSAGE PASSING WITH DENOISING

(71) Applicant: North Carolina State University, Raleigh, NC (US)

(72) Inventors: Dror Baron, Raleigh, NC (US); Jin Tan, Raleigh, NC (US); Yanting Ma, Raleigh, NC (US)

(73) Assignee: NORTH CAROLINA STATE UNIVERSITY, Raleigh, NC (US)

( * ) Notice: Subject to any disclaimer, the term of this patent is extended or adjusted under 35 U.S.C. 154(b) by 0 days.

(21) Appl. No.: 14/713,788

(22) Filed: May 15, 2015

(65) Prior Publication Data

US 2016/0048950 A1 Feb. 18, 2016

Related U.S. Application Data

(60) Provisional application No. 61/994,421, filed on May 16, 2014.

(51) Int. Cl.
 *G06K 9/40* (2006.01)
 *G06T 5/00* (2006.01)
 (Continued)

(52) U.S. Cl.
 CPC .............. *G06T 5/002* (2013.01); *G06T 9/00* (2013.01); *H03M 7/3062* (2013.01);
 (Continued)

(58) Field of Classification Search
 None
 See application file for complete search history.

(56) References Cited

U.S. PATENT DOCUMENTS

2006/0239336 A1* 10/2006 Baraniuk ............... H04L 25/20
 375/216
2014/0126808 A1* 5/2014 Geisler .................. G06T 5/002
 382/159

(Continued)

OTHER PUBLICATIONS

Hirakawa K et al: "An empirical Bayes EM-wavelet unification for simultaneous denoising, interpolation, and/or demosaicing" International Conference on Image Processing IEEE Piscataway, NJ, USA, Oct. 2006 (Oct. 2006), p. 4 pp., XP002469894 ISBN: 1-4244-0481-9.*

(Continued)

*Primary Examiner* — Andrae S Allison
(74) *Attorney, Agent, or Firm* — Thomas | Horstemeyer LLP; Christopher B. Linder; Randy R. Schoen

(57) ABSTRACT

Various examples of methods and systems are provided for compressive imaging using approximate message passing with denoising. According to an aspect, a method includes applying an approximate message passing (AMP) conversion framework to a plurality of substantially linear measurements for conversion into a plurality of scalar measurements. A denoiser algorithm can be applied to the plurality of scalar measurements to generate a plurality of denoised scalar measurements. Further, a conversion term can be applied to the plurality of denoised scalar measurements for converting the plurality of denoised scalar measurements to a plurality of denoised substantially linear measurements. The plurality of substantially linear measurements can represent two-dimensional or three-dimensional signals.

14 Claims, 14 Drawing Sheets

(51) Int. Cl.
G06T 9/00 (2006.01)
H03M 7/30 (2006.01)
H04N 19/85 (2014.01)
H04N 19/90 (2014.01)
H04N 19/80 (2014.01)

(52) U.S. Cl.
CPC ............ *H04N 19/85* (2014.11); *H04N 19/90* (2014.11); *G06T 2207/20064* (2013.01); *H04N 19/80* (2014.11)

(56) References Cited

U.S. PATENT DOCUMENTS

| | | | | |
|---|---|---|---|---|
| 2014/0185956 A1* | 7/2014 | Kawata | .............. | G06K 9/40 382/275 |
| 2014/0219552 A1* | 8/2014 | Porikli | .............. | G06T 5/002 382/155 |
| 2015/0036943 A1* | 2/2015 | Lin | .............. | G06T 5/003 382/264 |
| 2015/0206285 A1* | 7/2015 | Pajak | .............. | G06T 5/002 382/265 |
| 2015/0235350 A1* | 8/2015 | Kwan | .............. | G06T 5/002 382/254 |

OTHER PUBLICATIONS

Tan et al, Compressive Imaging via Approximate Message Passing With Image Denoising, IEEE Transactions on Signal Processing, vol. 63, No. 8, Apr. 15, 2015 2085.*
M. Kivanc Mihcak, I. Kozintsev, K. Ramchandran and P. Moulin, "Low-complexity image denoising based on statistical modeling of wavelet coefficients," in IEEE Signal Processing Letters, vol. 6, No. 12, pp. 300-303, Dec. 1999.*
N. Gupta, M. N. S. Swamy and E. I. Plotkin, "Wavelet domain-based video noise reduction using temporal discrete cosine transform and hierarchically adapted thresholding," in IET Image Processing, vol. 1, No. 1, pp. 2-12, Mar. 2007.*
J. Ma, G. Plonka and M. Y. Hussaini, "Compressive Video Sampling With Approximate Message Passing Decoding," in IEEE Transactions on Circuits and Systems for Video Technology, vol. 22, No. 9, pp. 1354-1364, Sep. 2012.*
Angelini et al, Compressed sensing with sparse, structured matrices, Fiftieth Annual Allerton Conference Allerton House, UIUC, Illinois, USA Oct. 1-5, 2012.*
W. Dong, X. Li, L. Zhang and G. Shi, "Sparsity-based image denoising via dictionary learning and structural clustering," Computer Vision and Pattern Recognition (CVPR), 2011 IEEE Conference on, Providence, RI, 2011, pp. 457-464.*
Aguello H, et al. Higher-order computational model for coded aperture spectral imaging. Applied Optics / vol. 52, No. 10 / Apr. 1, 2013.
Bayati M and Montanari A. The Dynamics of Message Passing on Dense Graphs, with Applications to Compressed Sensing. IEEE Transactions on Information Theory, vol. 57, No. 2, Feb. 2011.
Donoho DL and Johnstone IM. Ideal spatial adaptation by wavelet shrinkage. Biometrika (1994), 81, 3, pp. 425-455.
Metzler CA et al. From Denoising to Compressed Sensing. Arxiv preprint arxiv: 1406.4175v2, Jun. 2014.
Mihcak MK et al. Low-Complexity Image Denoising Based on Statistical Modeling of Wavelet Coefficients. IEEE Signal Processing Letters, vol. 6, No. 12, Dec. 1999.
Tan J et al. (2015) Compressive Imaging via Approximate Message Passing with Image Denoising. IEEE Signal Processing, vol. 63(8) 2085-2092.
Tan J et al. (2014) Compressive Imaging via Approximate Message Passing with Wavelet-Based Image Denoising. IEEE Global Conference on Signal and Information Processing. pp. 424-428.

\* cited by examiner

COMPRESSIVE IMAGING USING APPROXIMATE MESSAGE PASSING WITH DENOISING

CROSS REFERENCE TO RELATED APPLICATIONS

This application claims priority to, and the benefit of, U.S. provisional application entitled "SYSTEMS AND METHODS FOR COMPRESSIVE IMAGING USING APPROXIMATE MESSAGE PASSING WITH DENOISING" having Ser. No. 61/994,421, filed May 16, 2014, which is hereby incorporated by reference in its entirety.

STATEMENT REGARDING FEDERALLY SPONSORED RESEARCH OR DEVELOPMENT

This invention was made with government support under grant 1217749 awarded by the National Science Foundation and grants W911 NF-14-1-0314 and W911NF-04-D-0003 awarded by the U.S. Army Research Office. The Government has certain rights in the invention.

BACKGROUND

Compressed sensing (CS) has sparked a tremendous amount of research activity in recent years, because it performs signal acquisition and processing using far fewer samples than required by the Nyquist rate. In signal processing, the Nyquist rate, named after Harry Nyquist, is twice the bandwidth of a bandlimited function or a bandlimited channel. Breakthroughs in CS have the potential to greatly reduce the sampling rates in numerous signal processing applications, for example, cameras, medical scanners, fast analog to digital converters, and high speed radar.

SUMMARY

This disclosure relates to compressive imaging, including systems and methods for compressive imaging using approximate message passing with denoising. According to an aspect, a method includes applying an approximate message passing (AMP) conversion framework to a plurality of substantially linear measurements for conversion into a plurality of scalar measurements. The method can further include applying a denoiser algorithm to the plurality of scalar measurements to generate a plurality of denoised scalar measurements. Further, the method can include applying a conversion term to the plurality of denoised scalar measurements for converting the plurality of denoised scalar measurements to a plurality of denoised substantially linear measurements. The method can be implemented using at least one processor and memory.

Other systems, methods, features, and advantages of the present disclosure will be or become apparent to one with skill in the art upon examination of the following drawings and detailed description. It is intended that all such additional systems, methods, features, and advantages be included within this description, be within the scope of the present disclosure, and be protected by the accompanying claims.

BRIEF DESCRIPTION OF THE DRAWINGS

Many aspects of the present disclosure can be better understood with reference to the following drawings. The components in the drawings are not necessarily to scale, emphasis instead being placed upon clearly illustrating the principles of the present disclosure. Moreover, in the drawings, like reference numerals designate corresponding parts throughout the several views.

DETAILED DESCRIPTION

Figure 1:
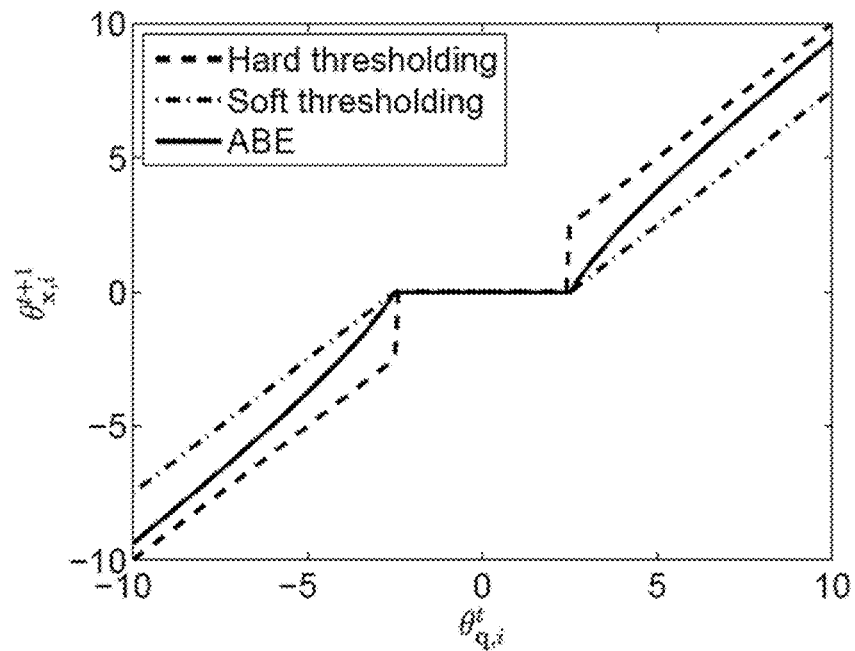
FIG. 1 is an example of an amplitude-scale invariant Bayes estimator (ABE) with hard and soft thresholding in accordance with various embodiments of the present disclosure.

Disclosed herein are various examples related to compressive imaging, including systems and methods for compressive imaging using approximate message passing with denoising. Reference will now be made in detail to the description of the embodiments as illustrated in the drawings, wherein like reference numbers indicate like parts throughout the several views.

Compressed sensing has been used in compressive imaging, where the input signal is an image, and the goal is to acquire the image using as few measurements as possible. Acquiring images in a compressive manner requires less sampling time than conventional imaging technologies. Applications of compressive imaging appear in medical imaging, seismic imaging, and hyperspectral imaging. However, existing compressive imaging algorithms may not achieve good reconstruction quality or may not be fast enough.

Consider compressive imaging problems, where images are reconstructed from a reduced number of linear measurements. To improve over existing compressive imaging algorithms in terms of both reconstruction error and runtime, compressive imaging algorithms that employ the approximate message passing (AMP) framework can be used. AMP is an iterative signal reconstruction algorithm that performs scalar denoising at each iteration. In order for AMP to reconstruct the original input signal well, a good denoiser should be used. Two wavelet based image denoisers can be applied within AMP where, for example, the first denoiser is an "amplitude-scale invariant Bayes estimator" (ABE), and the second denoiser is an adaptive Wiener filter. These AMP based algorithms for compressive imaging can be called AMP-ABE and AMP-Wiener. Numerical results show that both AMP-ABE and AMP-Wiener significantly improve over the state of the art in terms of runtime. In terms of reconstruction quality, AMP-Wiener offers lower mean square error (MSE) than existing compressive imaging algorithms. In contrast, AMP-ABE has higher MSE, because ABE does not denoise as well as the adaptive Wiener filter.

Compressed sensing (CS) has sparked a tremendous amount of research activity in recent years, because it performs signal acquisition and processing using far fewer samples than required by the Nyquist rate. Breakthroughs in CS have the potential to greatly reduce the sampling rates in numerous signal processing applications such as cameras, medical scanners, fast analog to digital converters, and high speed radar.

Many compressive imaging algorithms have been proposed. For example, the structure of the wavelet coefficients may be modeled by a hidden Markov tree (HMT), and applied a turbo scheme that alternates between inference on the HMT structure with standard belief propagation and inference on the compressed sensing measurement structure with the generalized approximate message passing algorithm. A hierarchical Bayesian approach with Markov chain Monte Carlo (MCMC) may be used for natural image reconstruction. A hierarchical dictionary learning method may be exploited and assumed that projecting images onto the learned dictionary will yield tree-sparsity, and therefore the nonzero supports of the dictionary can be identified and estimated accurately by setting an appropriate threshold.

However, existing compressive imaging algorithms may either not achieve good reconstruction quality or not be fast enough. Therefore, in this disclosure, a variation of a fast and effective algorithm called approximate message passing (AMP) is presented to improve over the prior art. AMP is an iterative signal reconstruction algorithm that performs scalar denoising within each iteration. Proper selection of the denoising function used within AMP can obtain better reconstruction quality. One challenge in applying image denoisers within AMP is the difficulty in computing the so called "Onsager reaction term" (or Onsager correction term) in the AMP iteration steps. The Onsager reaction term includes the derivative of the image denoising function and thus, if an image function does not have a convenient closed form, the Onsager reaction term may be difficult to compute.

There are two popular classes of image denoisers: wavelet-based methods and dictionary learning methods. A typical wavelet-based image denoiser proceeds as follows: (i) apply a wavelet transform to the image and obtain wavelet coefficients; (ii) denoise the wavelet coefficients; and (iii) apply an inverse wavelet transform to the denoised wavelet coefficients, yielding a denoised image. Two popular examples of denoisers that can be applied to the wavelet coefficients are hard thresholding and soft thresholding.

Dictionary learning is another effective technique in image denoising. Dictionary learning based methods generally achieve lower reconstruction error than wavelet-based methods. However, the learning procedure uses a large amount of training images, and may involve manual tuning. Owing to these limitations, this disclosure examines integrating relatively simple and fast image denoisers (e.g., wavelet-based image denoisers) into compressive imaging reconstruction algorithms.

An image denoising strategy was developed that employs collaborative filtering in a sparse 3-D transform domain, and offered an efficient implementation that achieved favorable denoising quality. Other efficient denoising schemes include wavelet-based methods. A typical wavelet-based image denoiser proceeds as follows: (i) apply a wavelet transform to the image and obtain wavelet coefficients; (ii) denoise the wavelet coefficients; and (iii) apply an inverse wavelet transform to the denoised wavelet coefficients, yielding a denoised image. Two popular examples of denoisers that can be applied to the wavelet coefficients are hard thresholding and soft thresholding.

This disclosure develops compressive imaging algorithms that are fast and reconstruct well. The "amplitude-scale-invariant Bayes estimator" (ABE) and/or the adaptive Wiener filter can be applied as image denoisers within AMP. Numerical results with these denoisers are presented, showing that AMP based algorithms run at least 3.5 times faster than the prior art algorithms. Moreover, with a proper choice of image denoiser within the AMP, the proposed algorithm also outperforms the prior art algorithms in reconstruction quality. Testing was performed for two wavelet-based image denoisers within the AMP, however other image denoisers may also work within the AMP framework, and these denoisers need not be wavelet-based.

Before reviewing AMP, consider how measurements are obtained in a compressive imaging system. For matrix channels, the input image x, which is comprised of N pixels, can be rearranged as a column vector of length N (for example, for a 512×512 image, $N=512^2$). Next, multiply x by a known measurement matrix $A \in \mathbb{R}^{M \times N}$, which has M rows (typically M<N). Finally, the measurements are corrupted by independent and identically distributed (i.i.d.) zero-mean Gaussian noise z, as expressed by:

$$y = Ax + z, \quad (1)$$

where the noisy vector $y \in \mathbb{R}^M$. The original input signal x is estimated and reconstructed from y and A.

The matrix channel can be converted to scalar channels, where the noisy observations obey:

$$q_i = x_i + v_i, \quad (2)$$

$i \in \{1, 2, \ldots, N\}$, the subscript $(.)_i$ denotes the i-th component of a vector, and x, $q \in \mathbb{R}^N$ are the input signal and the noisy observations, respectively. The noise v is i.i.d. Gaussian, $v_i \sim \mathcal{N}(0, \sigma^2)$. Note that different notations are used for the noise and observations in matrix channels and scalar channels. The main difference between the two types of channels is that the observations y in the matrix channel contain linear combinations of the entries of x.

Turning next to AMP, which is an iterative signal reconstruction algorithm in matrix channels, consider the matrix channel model of Eqn. (1) where the signal distribution follows $x_i \sim f_X$ and the noise is i.i.d. Gaussian. The entries of the measurement matrix A are i.i.d. $\mathcal{N}(0, 1/M)$ distributed, and thus the columns of the matrix have unit $\ell_2$-norm, on average. AMP proceeds iteratively according to:

$$x^{t+1} = \eta_t(A^T r^t + x^t), \quad (3)$$

$$r^t = y - Ax^t + \frac{1}{R} r^{t-1} \langle \eta'_{t-i}(A^T r^{t-1} + x^{t-1}) \rangle, \quad (4)$$

where $A^T$ is the transpose of A, R=M/N represents the measurement rate, $\eta_t(.)$ is a denoising function at the t-th iteration, $$\eta'_t(s) = \frac{\partial}{\partial s} \eta_t(s), \text{ and } \langle u \rangle = \frac{1}{n} \sum_{i=1}^{N} u_i$$

for some vector $u = (u_1, u_2, \ldots, u_N)$. The last term in Eqn. (4) is called the "Onsager reaction term" in statistical physics. In the t-th iteration, the vectors $x^t \in \mathbb{R}^N$ and $r^t \in \mathbb{R}^M$ are obtained. The vector $A^T r^t + x^t \in \mathbb{R}^N$ in Eqn. (3) can be regarded as noisy measurements of x in the t-th iteration with noise variance $\sigma_t^2$, and therefore the denoising function $\eta_t(.)$ is performed on a scalar channel of Eqn. (2). Let the equivalent scalar channel at iteration t be denoted by:

$$q^t = A^T r^t + x^t = x + v^t, \quad (5)$$

where $v^t \sim \mathcal{N}(0, \sigma_t^2)$. The asymptotic performance of AMP can be characterized by a state evolution (SE) formalism:

$$\sigma_{t+1}^2 = \sigma_z^2 + \frac{1}{R} E[(\eta_t(X - \sigma_t W) - X)^2], \quad (6)$$

where the random variables $W \sim \mathcal{N}(0,1)$ and $X \sim f_X$. Formal statements about SE appear in "The dynamics of message passing on dense graphs, with applications to compressed sensing" by M. Bayati and A. Montanari (IEEE Trans. Inf. Theory, vol. 57, no. 2, pp. 764-785, February 2011), which is hereby incorporated by reference in its entirety. Note that SE of Eqn. (6) tracks the noise variance for AMP iterations, but the noise variance $\sigma_{t+1}^2$ need not be the smallest possible, unless in each iteration the denoiser $\eta_t(.)$ achieves the minimum mean square error (MMSE). Note that a denoiser called "MixD" has been proposed that achieves the MMSE of scalar channels of Eqn. (2), and thus applying MixD within AMP achieves the MMSE of matrix channels of Eqn. (1). On the other hand, it is unrealistic to expect existing image denoisers to achieve the MMSE, because the statistical distribution of natural images has yet to be determined. That said, running AMP with good image denoisers that achieve lower mean square error (MSE) may yield lower MSE in compressive imaging problems.

Finally, SE theoretically characterizes the noise variance $\sigma_t^2$ of the scalar channel at each iteration. However, the MSE performance of image denoisers cannot be characterized theoretically. Therefore, the effective Gaussian noise level $\sigma_t^2$ is estimated empirically in each AMP iteration. The estimated noise variance $\hat{\sigma}_t^2$ can be calculated as:

$$\hat{\sigma}_t^2 = \frac{1}{M} \sum_{i=1}^{M} (r_i^t)^2, \quad (7)$$

where $r^t$ is defined in Eqn. (4).

In image processing, one often computes the wavelet coefficients of images, applies some signal processing technique to the wavelet coefficients, and finally applies the inverse wavelet transform to the processed coefficients to obtain processed images. How image denoising can be performed within AMP in the wavelet domain is now discussed. Let the wavelet transform be denoted by $\mathcal{W}$ and the inverse wavelet transform by $\mathcal{W}^{-1}$. By applying the wavelet transform to a vectorized image signal x (a 2-dimensional wavelet transform is used), the wavelet coefficient vector $\theta_x = \mathcal{W} x$ can be obtained. Conversely, $x = \mathcal{W}^{-1} \theta_x$. Therefore, the matrix channel of Eqn. (1) becomes $y = A \mathcal{W}^{-1} \theta_x + z$, where $A \mathcal{W}^{-1}$ can be regarded as a new matrix in the matrix channel of Eqn. (1) and $\theta_x$ as the corresponding input signal.

Express the AMP iterations of Eqns. (3) and (4) for settings where the matrix is $A \mathcal{W}^{-1}$, $$\theta_x^{t+1} = \eta_t((A\mathcal{W}^{-1})^T r^t + \theta_x^t), \quad (8)$$

$$r^t = y - (A\mathcal{W}^{-1})\theta_x^t + \frac{1}{R} r^{t-1} \langle \eta'_{t-i}((A\mathcal{W}^{-1})^T r^{t-1} + \theta_x^{t-1}) \rangle \quad (9)$$

$$= y - Ax^t + \frac{1}{R} r^{t-1} \langle \eta'_{t-i}((A\mathcal{W}^{-1})^T r^{t-1} + \theta_x^{t-1}) \rangle.$$

Because the wavelet transform matrix is orthonormal, i.e., $\mathcal{W}\mathcal{W}^T = I = \mathcal{W}\mathcal{W}^{-1}$, it can be shown that $(A\mathcal{W}^{-1})^T = \mathcal{W} A^T$. Therefore, the input of the denoiser $\eta_t(.)$ of Eqn. (8) becomes:

$$(A\mathcal{W}^{-1})^T r^t + \theta_x^t = \mathcal{W} A^T r^t + \theta_x^t = \mathcal{W} A^T r^t + \mathcal{W} x^t = \mathcal{W} q^t, \quad (10)$$

where $q^t$ of Eqn. (5) is the noisy image at iteration t, and $\mathcal{W} q^t$ is the wavelet transform $\mathcal{W}$ applied to the noisy image.

With the above analysis of the modified AMP of Eqns. (8) and (9), a compressive imaging procedure can be formulated as follows. Let the wavelet transform of the scalar channel of Eqn. (5) be denoted by:

$$\theta_q^t = \theta_x + \theta_v^t, \quad (11)$$

where $\theta_q^t = \mathcal{W} q^t$, $\theta_x = \mathcal{W} x$, and $\theta_v^t = \mathcal{W} v^t$. First, $r^t$ and $x^t$ are initialized to all-zero vectors. Then, at iteration t the algorithm proceeds as follows, 1) Calculate the residual term $r^t$.
2) Calculate the noisy image $q^t = A^T r^t + x^t$, and apply the wavelet transform $\mathcal{W}$ to the noisy image $q^t$ to obtain wavelet coefficients $\theta_q^t$, which are the inputs of the scalar denoiser $\eta_t(.)$ in Eqn. (8).

3) Apply the denoiser $\eta_t(.)$ to the wavelet coefficients $\theta_q^t$, and obtain denoised coefficients $\theta_x^{t+1}$.

4) Apply the inverse wavelet transform $\mathcal{W}^{-1}$ to the coefficients $\theta_x^{t+1}$ to obtain the estimated image $x^{t+1}$, which is used to compute the residual term in the next iteration.

The wavelet coefficients can be denoised using scalar denoisers proposed by "Wavelet-based image estimation: An empirical Bayes approach using Jeffrey's noninformative prior" by M. Figueiredo and R. Nowak (IEEE Trans. Image Process., vol. 10, no. 9, pp. 1322-1331, September 2001) and "Low complexity image denoising based on statistical modeling of wavelet coefficients" by Mihcak et al. (IEEE Signal Process. Letters, vol. 6, no. 12, pp. 300-303, December 1999), respectively, because these two denoisers can implement while revealing promising numerical results. Both of these are incorporated by reference in their entirety. The algorithm where ABE is utilized within AMP is designated "AMP-ABE," and the algorithm where the adaptive Wiener filter is utilized is designated "AMP-Wiener." In both algorithms, the variance of the noise $\sigma_t^2$ in the noisy image is obtained using Eqn. (7). Because an orthonormal wavelet transform is used, the noise variance in the wavelet domain is equal to that in the image domain. Although only two image denoisers are shown employed within AMP, they serve as a proof of concept that other image denoisers could also be applied within AMP, possibly leading to further improvements in both image reconstruction quality and runtime.

Amplitude-Scale-Invariant Bayes Estimator:

Figueiredo and Nowak's denoiser is an amplitude-scale-invariant Bayes estimator (ABE), and it is a scalar function. More specifically, for each noisy wavelet coefficient $\theta_{q,i}^t$, of Eqn. (11), the estimate of $\theta_{x,i}$ for the next iteration is:

$$\theta_{x,i}^{t+1} = \eta_t(\theta_{q,i}^t) = \frac{((\theta_{q,i}^t)^2 - 3\sigma_t^2)_+}{\theta_{q,i}^t}, \quad (12)$$

where $\sigma_t^2$ is the noise variance of the scalar channel of Eqn. (5) at the t-th AMP iteration, and $(.)_+$ is a function such that $(u)_+ = u$ if $u>0$ and $(u)_+ = 0$ if $u \leq 0$. Note that because the wavelet transform matrix $\mathcal{W}$ is orthonormal, the variance of the noise $v^t$ of Eqn. (5) is equal to the variance of $\theta_v^t$ of Eqn. (11).

FIG. 1 illustrates an example of the ABE function with hard and soft thresholding. It can be seen that ABE offers a compromise between the hard thresholding, i.e., $\eta(u, \tau) = u \cdot \mathbb{1}_{(|u|>|\tau|)}$, where $\mathbb{1}_{\{.\}}$ denotes an indicator function, and soft thresholding, i.e., $\eta(u, \tau) = \text{sign}(u) \cdot (|u| - \tau)_+$, proposed by "Ideal spatial adaptation by wavelet shrinkage" by D. L. Donoho and J. Johnstone (Biometrika, vol. 81, no. 3, pp. 425-455, September 1994), which is hereby incorporated by reference in its entirety. ABE is convenient to utilize, because there is no need to tune the thresholding values, and ABE has been shown to outperform both hard and soft thresholding methods for image denoising.

The ABE function is continuous and differentiable except for two points ($\theta_{q,i}^t = \pm\sqrt{3}\sigma_t$), and the derivative of this denoising function can be calculated numerically to obtain the Onsager reaction term in Eqn. (4).

Adaptive Wiener Filter:

"Low complexity image denoising based on statistical modeling of wavelet coefficients" by Mihcak et al. (IEEE Signal Process. Letters, vol. 6, no. 12, pp. 300-303, December 1999), which is hereby incorporated by reference in its entirety, proposed a method to estimate the variances of the wavelet coefficients, and then apply the corresponding Wiener filter to each wavelet coefficient. The variance of the noisy wavelet coefficient $\theta_{q,i}^t$ is estimated from its neighboring coefficients. More specifically, a set of 3×3 or 5×5 neighboring coefficients $\mathcal{N}_i$ that is centered at $\theta_{q,i}^t$ is considered, and the variance of $\theta_{q,i}^t$ is estimated by averaging the sum of $(\theta_{q,i}^t)^2$ where $k \in \mathcal{N}_i$. This method of averaging the neighboring coefficients can be regarded as first convolving a 3×3 or 5×5 mask of all 1's with the matrix of squared wavelet coefficients $\theta_q^t$, and then dividing by the normalizing constant 9 (for a 3×3 mask) or 25 (for a 5×5 mask). Other masks can be applied to produce different and possibly better denoising results. For example, the mask $$\begin{array}{ccccc} & 1 & 1 & 1 & \\ 1 & 1 & 2 & 1 & 1 \\ 1 & 2 & 3 & 2 & 1 \\ 1 & 1 & 2 & 1 & 1 \\ & 1 & 1 & 1 & \end{array}$$

has been found to obtain lower MSE than other 5×5 masks that have been considered. Recall the scalar channel defined in Eqn. (11) where the noise variance is $\sigma_t^2$; the variance of a noisy wavelet coefficient $\theta_{q,i}^t$ can be estimated by $\hat{\sigma}_i^2$, and the variance of the true wavelet coefficient $\theta_{x,i}^t$ by $\hat{\sigma}_i^2 - \sigma_t^2$. The max $\{\hat{\sigma}_i^2 - \sigma_t^2, 0\}$ was used to restrict the variance to be non-negative. Therefore, the scaling factor in the Wiener filter can be given by $$\frac{\hat{\sigma}_i^2 - \sigma_t^2}{(\hat{\sigma}_i^2 - \sigma_t^2) + \sigma_t^2},$$

and the adaptive Wiener filter being used as the denoising function can be expressed as follows:

$$\theta_{x,i}^{t+1} = \eta_t(\theta_{q,i}^t) = \frac{\hat{\sigma}_i^2 - \sigma_t^2}{(\hat{\sigma}_i^2 - \sigma_t^2) + \sigma_t^2} \theta_{q,i}^t = \frac{\hat{\sigma}_i^2 - \sigma_t^2}{\hat{\sigma}_i^2} \theta_{q,i}^t. \quad (13)$$

Finally, the derivative of this denoising function with respect to $\theta_{q,i}^t$ is simply the scaling factor $$\frac{\hat{\sigma}_i^2 - \sigma_t^2}{\hat{\sigma}_i^2}$$

of the Wiener filter, and so the Onsager reaction term in Eqn. (4) can be obtained efficiently.

In standard AMP, the denoising function $\eta_t(.)$ is separable, meaning that $\theta_{x,i}^{t+1}$ only depends on its corresponding noisy wavelet coefficient $\theta_{q,i}^t$. In the adaptive Wiener filter, however, the estimated variance $\hat{\sigma}_i^2$ of each noisy wavelet coefficient depends on the neighboring coefficients of $\theta_{q,i}^t$, and so the denoising function in Eqn. (13) implicitly depends on the neighboring coefficients of $\theta_{q,i}^t$. Therefore, the adaptive Wiener filter in Eqn. (13) is not a strictly separable denoising function, and AMP-Wiener encounters convergence issues. Fortunately, a technique called "damping" solves for the convergence problem of AMP-Wiener. Specifically, damping is an extra step in the AMP iteration of Eqn. (3); instead of updating the value of $x^{t+1}$ by the output of the denoiser $\eta_t(A^T r^t + x^t)$, a weighted sum of $\eta_t(A^T r^t + x^t)$ and $x^t$ to $x^{t+1}$ can be assigned as follows:

$$x^{t+1} = (1-\lambda) \cdot \eta_t(A^T r^t + x^t) + \lambda \cdot x^t, \qquad (14)$$

for some constant $0 \leq \lambda < 1$. It has been shown that sufficient damping ensures the convergence of AMP where the measurement matrix A is not i.i.d. Gaussian. However, i.i.d. Gaussian matrices were used for numerical results, and damping solved the convergence problem of AMP-Wiener, which suggests that damping may be an effective technique when various convergence issues arise in AMP based algorithms. Note that other techniques such as SwAMP (swept AMP) and ADMM-GAMP (alternating direction method of multipliers-generalized AMP) can also be used to solve the convergence problem in AMP.

Reconstruction Quality and Runtime

Numerical results from applying these two denoisers within AMP are now described. AMP-ABE and AMP-Wiener are compared with three prior art compressive imaging algorithms, (i) Turbo-BG; (ii) Turbo-GM; and (iii) a Markov chain Monte Carlo (MCMC) method. Both Turbo-BG and Turbo-GM are also message passing based algorithms. However, these two algorithms require more computation than AMP-ABE and AMP-Wiener, because they include two message passing procedures; the first procedure solves for dependencies between the wavelet coefficients and the second procedure is AMP. The performance metrics that are used to compare the algorithms are runtime and normalized MSE (NMSE), $\text{NMSE}(x, \hat{x}) = 10 \log_{10}(\|x-\hat{x}\|_2^2 / \|x\|_2^2)$, where a is the estimate of the vectorized input image x. In all simulations, the Haar wavelet transform was used.

To begin, contrast the three prior art compressive imaging algorithms based on the numerical results. Turbo-BG and Turbo-GM have similar runtimes; the NMSE of Turbo-GM is typically 0.5 dB better (lower) than the NMSE of Turbo-BG. At the same time, the NMSE of the MCMC algorithm is comparable to those of Turbo-BG and Turbo-GM, but MCMC is 30 times slower than the Turbo approaches. Other algorithms have also been considered for compressive imaging. For example, compressive sampling matching pursuit (CoSaMP) requires only half the runtime of Turbo-GM, but its NMSE is roughly 4 dB worse than that of Turbo-GM; and model based CS is twice slower than Turbo-GM and its NMSE is also roughly 4 dB worse. Therefore, numerical results are provided for Turbo-BG, Turbo-GM, MCMC, and the two AMP based approaches.

Numerical Setting:

591 images were downloaded from the "pixel-wise labeled image database v2" at http://research.microsoft.com/en-us/projects/objectclassrecognition, and image patches were extracted using the following two methods.

Method 1: A 192×192 patch was extracted from the upper left corner of each image, and then the patch was resized to 128×128.

Method 2: A 192×192 patch was extracted from the upper left corner of each image without resizing.

The measurement matrix $A \in \mathbb{R}^{M \times N}$ is generated with i.i.d. Gaussian entries distributed as $\mathcal{N}(0, 1/M)$; each column is then normalized to have unit norm. For the 128×128 patches extracted by method 1, the number of measurements M=5,000. For the 192×192 patches extracted by method 2, the number of measurements M=11,059, i.e., a measurement rate of 0.3. In both methods, the measurements y are noiseless, i.e., y=Ax. Finally, we set the number of AMP iterations to be 30 and the damping constant $\lambda$ of Eqn. (14) for AMP-Wiener to be 0.1.

Figure 2:
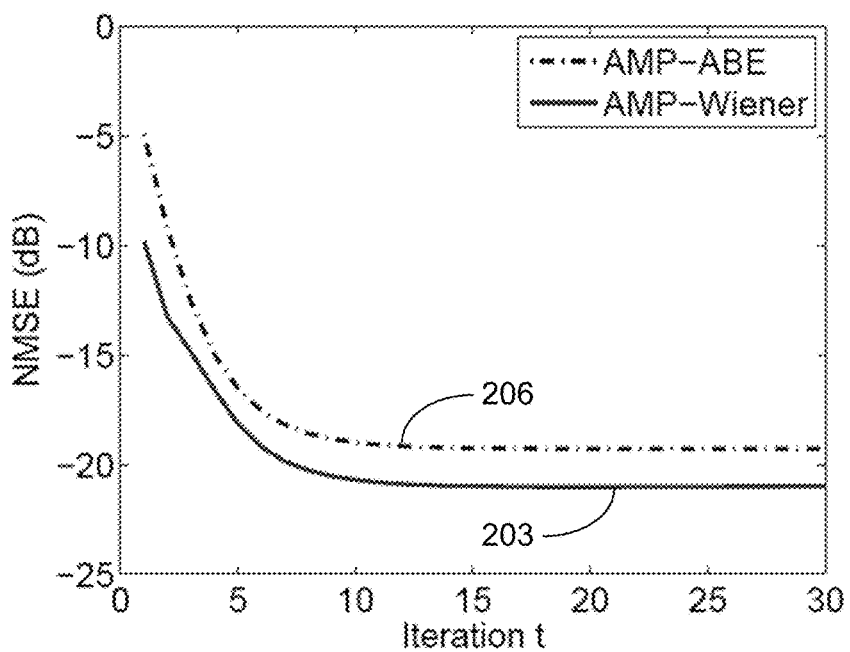
FIGS. 2 and 3 are examples of average NMSE over 591 images over AMP iterations 1 to 30 in accordance with various embodiments of the present disclosure.
Figure 3:
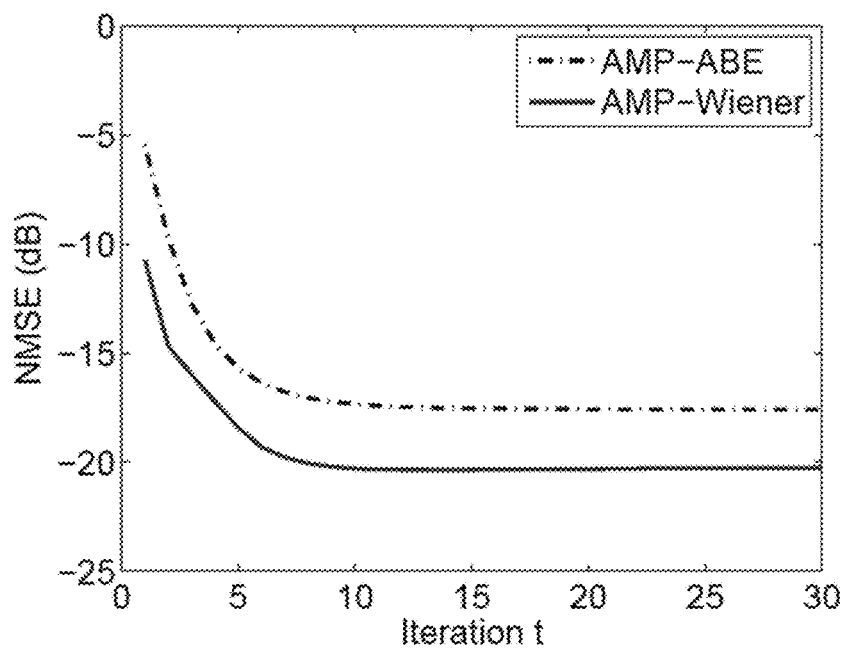

Result 1:

TABLES 1 and 2 show the NMSE and runtime averaged over the 591 image patches that are extracted by methods 1 and 2, respectively. Runtime was measured in seconds on a Dell OPTIPLEX 9010 running an Intel® Core™ i7-860 with 16 GB RAM, and the environment is Matlab R2013a. FIGS. 2 and 3 complement TABLES 1 and 2, respectively, by plotting the average NMSE over 591 images from iteration 1 to iteration 30.

TABLE 1

| Algorithm | NMSE (dB) | Runtime (sec) |
| --- | --- | --- |
| Turbo-BC [12] | −20.37 | 12.39 |
| Turbo-GM [12] | −20.72 | 12.47 |
| MCMC [13] | −20.31 | 423.15 |
| AMP-ABE | −19.30 | 3.39 |
| AMP-Wiener | −21.00 | 3.34 |

TABLE 2

| Algorithm | NMSE (dB) | Runtime (sec) |
| --- | --- | --- |
| Turbo-GM [12] | −19.64 | 56.12 |
| AMP-ABE | −17.57 | 15.99 |
| AMP-Wiener | −20.29 | 15.53 |

It can be seen from TABLE 1 that the NMSE of AMP-Wiener is the best (lowest) among all the algorithms compared. At the same time, AMP-Wiener runs approximately 3.5 times faster than the Turbo approaches, and 120 times faster than MCMC. Although AMP-ABE does not outperform the competing algorithms in terms of NMSE, it runs as fast as AMP-Wiener.

TABLE 1 presents the runtimes of AMP-ABE and AMP-Wiener for image patches extracted by method 1 with 30 iterations. However, it can be seen from FIG. 2 that AMP-ABE and AMP-Wiener with fewer iterations already achieve NMSEs that are close to the NMSE shown in TABLE 1. In FIG. 2, the horizontal axis represents iteration numbers, and the vertical axis represents NMSE. As shown in FIG. 2, the NMSE drops markedly from −10 dB to −21 dB for AMP-Wiener (solid line 203) and from −5 dB to −19 dB for AMP-ABE (dash-dot line 206), respectively. Note that the average NMSE is approximately −21 dB for AMP-Wiener and −19 dB for AMP-ABE around iteration 15. Therefore, the runtimes of AMP-ABE and AMP-Wiener may be halved (to approximately 1.7 seconds) by reducing the number of AMP iterations from 30 to 15.

The simulation for the larger image patches extracted by method 2 was slow, and thus the results for Turbo-BG and MCMC were not obtained for TABLE 2. It is believed that Turbo-BG is only slightly worse than Turbo-GM. At the same time, MCMC was tested on several images, and the NMSEs obtained by MCMC were usually 0.5 dB higher than AMP-Wiener and the runtimes of MCMC usually exceeded 1,500 seconds. Similar to FIG. 2, it can be seen from FIG. 3 that the runtimes of the AMP based approaches could be further reduced by reducing the number of AMP iterations without much deterioration in estimation quality.

Figure 4:
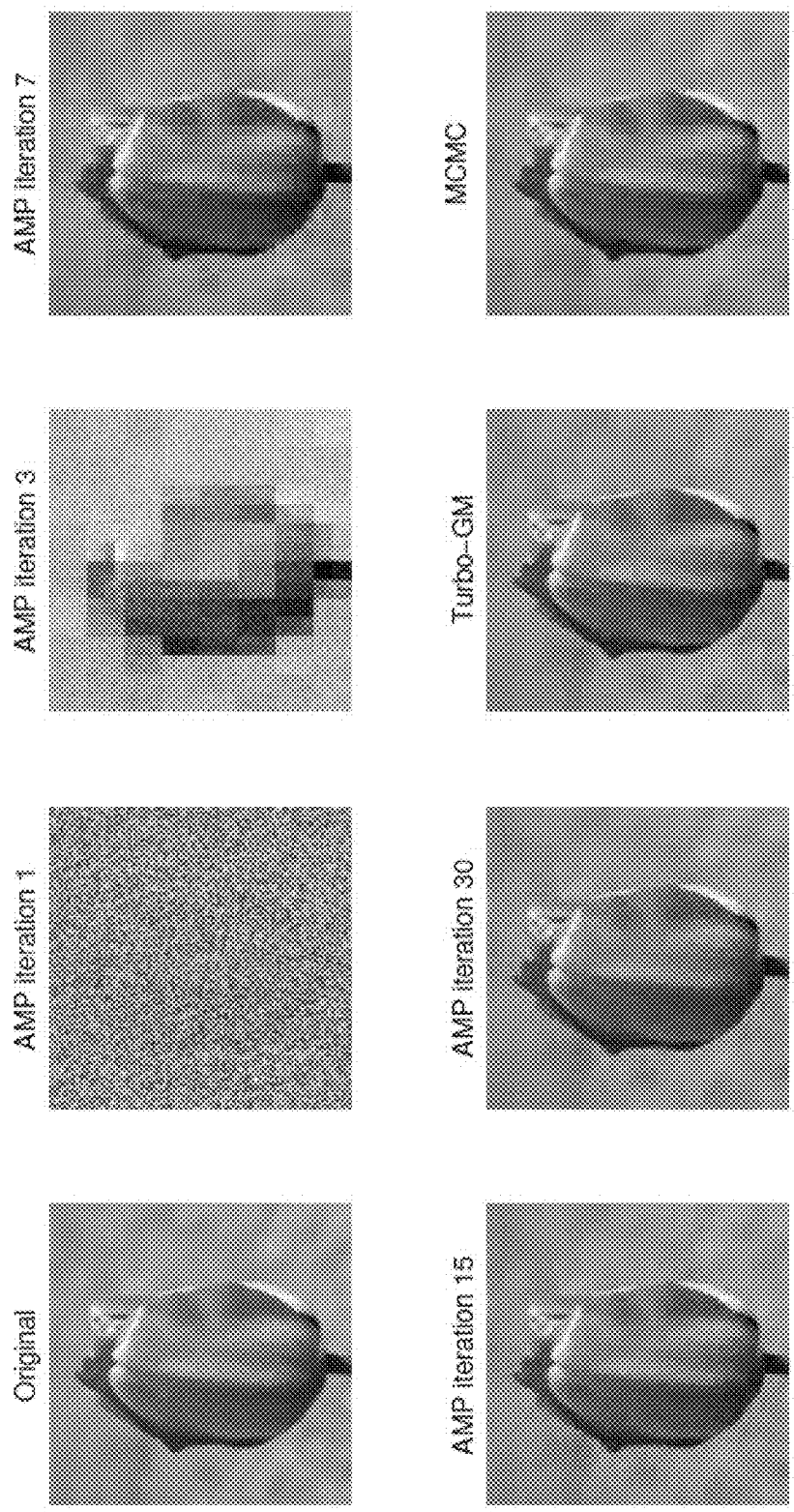
FIG. 4 includes example of image patches and the estimated patches using AMP-Wiener, Turbo-GM and Markov chain Monte Carlo (MCMC) in accordance with various embodiments of the present disclosure.

Result 2:

As a specific example, FIG. 4 illustrates one of the 591 image patches and the estimated patches using AMP-Wiener at iterations 1, 3, 7, 15, and 30. FIG. 4 includes the original "10_5_s.bmp" input image, the estimated images using AMP-Wiener at iterations 1, 3, 7, 15, 30, and the estimated images using Turbo-GM and MCMC. The image patch was extracted by method 1: a 192×192 patch was first extracted, and then resized to 128×128. The NMSE of each estimated image is as follows: AMP-Wiener iteration 1, −11.46 dB; AMP-Wiener iteration 3, −18.17 dB; AMP-Wiener iteration 7, −26.28 dB; AMP-Wiener iteration 15, −30.07 dB; AMP-Wiener iteration 30, −30.36 dB; Turbo-GM, −29.62 dB; and MCMC, −29.13 dB. It can be seen from FIG. 4 that the estimated images using AMP-Wiener are gradually denoised as the number of iterations is increased, and the NMSE achieved by AMP-Wiener at iteration 15 already produces better reconstruction quality than Turbo-GM and MCMC.

Performance of Scalar Denoisers

Having seen that AMP-Wiener consistently outperforms AMP-ABE, understanding why AMP-Wiener achieves lower NMSE than AMP-ABE is now considered.

Figure 5:
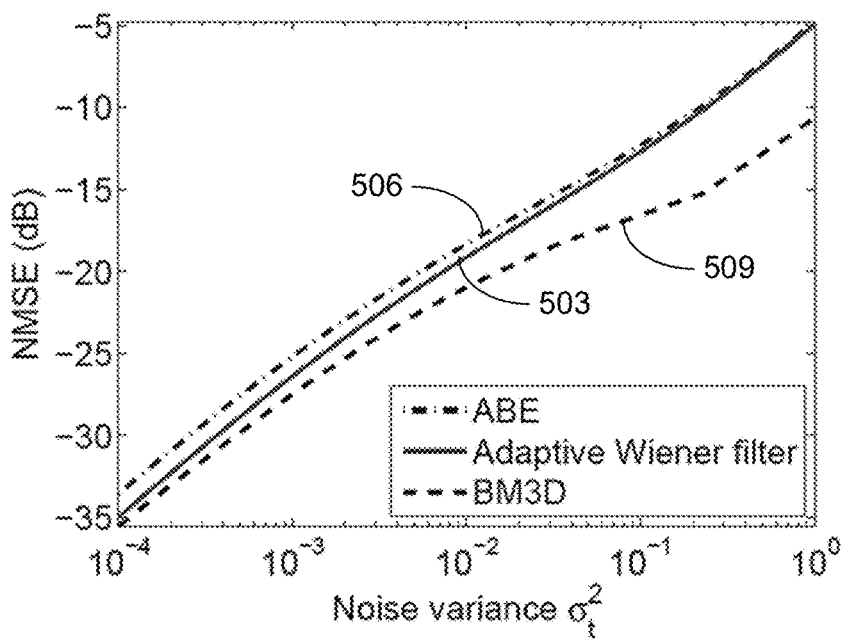
FIGS. 5-7 are examples of average NMSE over 591 images with respect to noise variance and measurement rate in accordance with various embodiments of the present disclosure.

The ABE and the adaptive Wiener filter were tested as scalar image denoisers in scalar channels as defined in Eqn. (2). In this simulation, the 591 image patches extracted by method 2 were used, and i.i.d. Gaussian noise $\mathcal{N}(0, \sigma^2)$ added to the image patches. The pixel values are normalized to be between 0 and 1, and we verified from the simulations for TABLE 2 that the estimated noise variances of the scalar channels in AMP iterations are typically between $1 \times 10^{-4}$ and 1. In FIG. 5, the vertical axis represents NMSE, and the horizontal axis represents different noise variances varying from $1 \times 10^{-4}$ to 1. It is shown in FIG. 5 that the adaptive Wiener filter (solid line 503) consistently achieves lower NMSE than ABE (dash-dot line 506) for all noise variances, which suggests that AMP-Wiener outperforms AMP-ABE in every AMP iteration, and thus outperforms AMP-ABE when stopping the iterating at iteration 30. Therefore, in order to achieve favorable reconstruction quality, it can be important to select a good image denoiser within AMP.

With this in mind, the NMSE of the image denoiser "block-matching and 3-D filtering" (BM3D) is included in FIG. 5, and find that BM3D (dashed line 509) has lower NMSE than the adaptive Wiener filter, especially when the noise variance is large. Note that the NMSEs of ABE for difference noise variances are within 1 dB of the NMSEs of the adaptive Wiener filter, but this performance gap in scalar denoisers is amplified to more than 2 dB (refer to TABLE 2) when applying the scalar denoisers within AMP. In other words, applying BM3D within AMP can achieve better reconstruction quality than AMP-Wiener. However, one challenge of applying BM3D within AMP is whether the Onsager reaction term in Eqn. (4) can be computed in closed form or numerically, and thus an alternative way of approximating the Onsager reaction term may need to be utilized. As shown by "From denoising to compressed sensing" by Metzler et al. (Arxiv preprint arxiv: 1406.4175v2, June 2014.), which is hereby incorporated by reference in its entirety, the Onsager correction term may be computed numerically allowing to use different image denoisers within AMP.

Reconstruction Quality Versus Measurement Rate

Finally, the performance of each algorithm is evaluated by plotting the NMSE (average NMSE over 591 images) versus the measurement rate R=M/N. The measurement matrix A is generated the same way as method 1 and method 2 of the numerical setting above.

Figure 6:
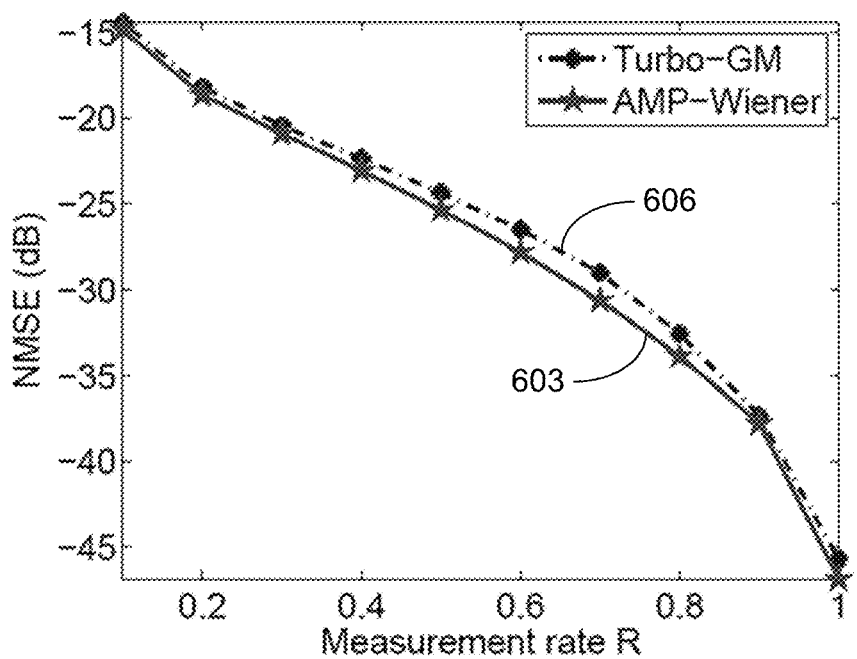
Figure 7:
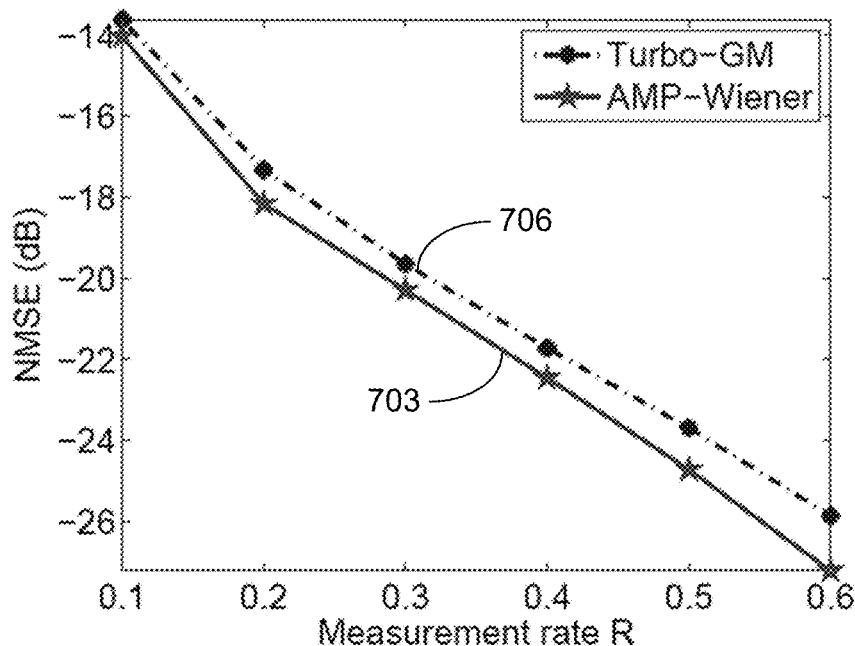

FIGS. 6 and 7 illustrate how the NMSEs achieved by AMP-Wiener and Turbo-GM vary when the measurement rate R changes, where the horizontal axis represents the measurement rate R=M/N, and the vertical axis represents NMSE. FIG. 6 shows the results for image patches extracted by method 1, and the measurement rate R varies from 0.1 to 1. FIG. 7 shows the results for image patches extracted by method 2. Because the simulation for 192×192 image patches is relatively slow, only the results for R that varies from 0.1 to 0.6 are shown. It can be seen from FIGS. 6 and 7 that AMP-Wiener (solid lines 603 and 703) achieves lower NMSE than that of Turbo-GM (dash-dot lines 606 and 706) for all values of R.

Review

Compressive imaging algorithms that apply image denoisers within AMP has been examined. The "amplitude-scale-invariant Bayes estimator" (ABE) and an adaptive Wiener filter have been used within AMP. Numerical results showed that AMP-Wiener achieves the lowest reconstruction error among all competing algorithms in all simulation settings, while AMP-ABE also offers competitive performance. Moreover, the runtimes of AMP-ABE and AMP-Wiener were significantly lower than those of MCMC and the Turbo approaches, and FIGS. 2 and 3 suggest that the runtimes of our AMP based algorithms could be reduced further if a slight deterioration in NMSE is accepted.

Recall that the input of the denoising function $\eta_t$ in Eqn. (3) is a noisy image with i.i.d. Gaussian noise, and so any image denoiser that deals with i.i.d. Gaussian noise may be applied within AMP. At the same time, in order to develop fast AMP based compressive imaging algorithms, the image denoisers that are applied within AMP should be fast. By comparing the denoising quality of ABE and the adaptive Wiener filter as image denoisers in scalar channels, using AMP with a better denoiser produces better reconstruction quality for compressive imaging problems. With this in mind, employing more advanced image denoisers within AMP may produce promising results for compressive imaging problems. For example, because different image denoisers work well within AMP in terms of both reconstruction quality and runtime, other image denoisers such as sparsity based simultaneous denoising and interpolation (SBSDI) or BM3D may also produce promising results for compressive imaging problems, provided that the derivative term $\langle \eta'_{t-i}(.) \rangle$ within the AMP iteration of Eqn. (4) can be obtained.

The squared error $\ell_2$-norm error) was used as the performance metric, and AMP-Wiener was shown to outperform the prior art. Besides the $\ell_2$-norm error, it has been shown that the SE in AMP also holds for other error metrics such as $\ell_2$-norm error where $p \neq 2$. When some error metric besides $\ell_2$-error is considered, denoisers can exist that are optimal for this error metric of interest, and thus by applying these denoisers within AMP it may be able to achieve optimal reconstruction results for the matrix channels.

Hyperspectral Imaging

Next, consider a compressive hyperspectral imaging reconstruction problem, where three-dimensional spatio-spectral information about a scene is sensed by a coded aperture snapshot spectral imager (CASSI). The CASSI imaging process can be modeled as suppressing three-dimensional coded and shifted voxels and projecting these onto a two-dimensional plane, such that the number of acquired measurements is greatly reduced. On the other hand, because the measurements are highly compressive, the reconstruction process becomes challenging. As previously discussed, a compressive imaging reconstruction algorithm based on the approximate message passing (AMP) framework can be applied to two-dimensional images. AMP is an iterative algorithm that can employ an adaptive Wiener filter as the image denoiser. This AMP-Wiener can be extended to three-dimensional hyperspectral image reconstruction. Applying the AMP framework to the CASSI system can be challenging, because the matrix that models the CASSI system is highly sparse, which makes it difficult for AMP to converge. The adaptive Wiener filter is modified to fit the three-dimensional image denoising problem, and employ a technique called damping to solve for the divergence issue of AMP. Simulation results show that applying AMP-Wiener to three-dimensional hyperspectral imaging problems outperforms widely-used algorithms such as gradient projection for sparse reconstruction (GPSR) and two-step iterative shrinkage/thresholding (TwIST) given the same amount of runtime. Moreover, in contrast to GPSR and TwIST, AMP-Wiener need not tune any parameters, which simplifies the reconstruction process.

A hyperspectral image is a three-dimensional (3D) image cube comprised of a collection of two-dimensional (2D) images (slices), where each 2D image is captured at a specific wavelength. Hyperspectral images allow for the analysis of spectral information about each spatial point in a scene, and thus can help identify different materials that appear in the scene. Therefore, hyperspectral imaging has applications to areas such as medical imaging, remote sensing, geology, and astronomy. Conventional spectral imagers include whisk broom scanners, push broom scanners, and spectrometers. In whisk broom scanners, a mirror reflects light onto a single detector, so that one pixel data is collected at a time; in push broom scanners, an image cube is captured with one focal plane array (FPA) measurement per spatial line of the scene; and in spectrometers, a set of optical bandpass filters are tuned in steps in order to scan the scene. The disadvantages of these techniques are that (i) data acquisition takes a long time, because a number of zones linearly scanned in proportion to the desired spatial and spectral resolution; and (ii) large amounts of data are acquired and must be stored and transmitted.

To address the limitations of conventional spectral imaging techniques, many spectral imager sampling schemes based on compressive sensing have been proposed. The coded aperture snapshot spectral imager (CASSI) is a popular compressive spectral imager and acquires image data from different wavelengths simultaneously. In CASSI, the voxels of a scene are first coded by an aperture, then dispersed by a dispersive element, and finally detected by a 2D FPA. That is, a 3D image cube is suppressed and measured by a 2D array, and thus CASSI acquires far fewer measurements than those acquired by conventional spectral imagers, which significantly accelerates the imaging process. On the other hand, because the measurements from CASSI are highly compressive, reconstructing 3D image cubes from CASSI measurements becomes challenging. Because of the massive size of the 3D image data, fast reconstruction algorithms can be developed to realize real time acquisition and processing.

It is possible to reconstruct the 3D cube from the 2D measurements according to the theory of compressive sensing, because the 2D images from different wavelengths are highly correlated, and the 3D image cube is sparse in an appropriate transform domain, meaning that only a small portion of the transform coefficients have large values. Approximate message passing (AMP) can be used to solve compressive sensing problems, owing to its performance and efficiency.

Several algorithms can be used to reconstruct image cubes from measurements acquired by CASSI. One of the efficient algorithms is gradient projection for sparse reconstruction (GPSR), which is fast and usually produces reasonable reconstruction. GPSR models hyperspectral image cubes as sparse in the Kronecker product of a 2D wavelet transform and a 1D discrete cosine transform (DCT), and solves the $l_1$-minimization problem to enforce sparsity in this transform domain. Besides using $l_1$-norm as the regularizer, total variation offers an alternative. For example, total variation can be employed as the regularizer in the two-step iterative shrinkage/thresholding (TwIST) framework, a modified and fast version of standard iterative shrinkage/thresholding. Apart from using the wavelet-DCT basis, a dictionary with which the image cubes can be sparsely represented can be learned. To improve the reconstruction quality of the dictionary learning based approach, a standard image with red, green, and blue (RGB) components of the same scene can be used as side information. That is, a coupled dictionary is learned from the joint datasets of the CASSI measurements and the corresponding RGB image. Note that using color sensitive RGB detectors directly as the FPA of CASSI is another way to improve the sensing of spectral images, because spatio-spectral coding can be attained in a single snapshot without needing extra optical elements.

Despite the good results attained with the algorithms mentioned above, they all need manual tuning of some parameters, which may be time consuming. In GPSR and TwIST, the optimal regularization parameter could be different in reconstructing different image cubes; in dictionary learning methods, the patch size and the number of dictionary atoms need to be chosen carefully.

In this case, a robust and fast reconstruction algorithm is developed for the CASSI system using approximate message passing (AMP). AMP is an iterative algorithm that can apply image denoising at each iteration. Previously, a 2D compressive imaging reconstruction algorithm (AMP-Wiener) was presented, where an adaptive Wiener filter was applied as the image denoiser within AMP. The numerical results showed that AMP-Wiener outperformed prior art algorithms in term of both reconstruction quality and runtime. The AMP-Wiener can be extended to reconstruct 3D hyperspectral images. Because the matrix that models the CASSI system is highly sparse, structured, and ill-conditioned, applying AMP to the CASSI system may be challenging. For example, (i) the noisy image cube that is obtained at each AMP iteration contains non-Gaussian noise; and (ii) AMP encounters divergence problems where the reconstruction error may increase with more iterations. In order to overcome these challenges, the adaptive Wiener filter can be modified to fit the 3D image denoising problem, and use damping, to encourage the convergence of AMP.

The algorithm was simulated on several different settings, and the numerical results show that AMP-Wiener reconstructs 3D image cubes with less runtime and higher quality than other compressive hyperspectral imaging reconstruction algorithms such as GPSR and TwIST, even when the regularization parameters in GPSR and TwIST have already been tuned. These favorable results provide AMP-Wiener major advantages over GPSR and TwIST. First, when the bottleneck is the time required to run the reconstruction algorithm, AMP-Wiener can provide the same reconstruction quality in 100 seconds that the other algorithms provide in 450 seconds (see e.g. FIG. 10). Second, when the bottleneck is the time required for signal acquisition by CASSI hardware, the improved reconstruction quality could allow to reduce the number of shots taken by CASSI by as much as a factor of 2 (see e.g. FIG. 15). Finally, the reconstructed image cube can be obtained by running AMP-Wiener only once, because AMP-Wiener does not need to tune any parameters. In contrast, the regularization parameters in GPSR and TwIST need to be tuned carefully. The optimal values of these parameters may vary for different test image cubes. In order to tune the parameters for each test image cube, GPSR and TwIST run many times with different parameter values, and then the ones that provide the best results are selected.

Mathematical Representation of CASSI:

The coded aperture snapshot spectral imager (CASSI) is a compressive spectral imaging system that collects far fewer measurements than traditional spectrometers. In CASSI, (i) the 2D spatial information of a scene is coded by an aperture, (ii) the coded spatial projections are spectrally shifted by a dispersive element, and (iii) the coded and shifted projections are detected by a 2D FPA. That is, in each coordinate of the FPA, the received projection is an integration of the coded and shifted voxels over all spectral bands at the same spatial coordinate. More specifically, let $f_0(x,y,\lambda)$ denote the density of a scene at spatial coordinate (x,y) and at wavelength $\lambda$, and let T(x,y) denote the coded aperture. The coded density $T(x,y)f_0(x,y,\lambda)$ is then spectrally shifted by the dispersive element along one of the spatial dimensions. The energy received by the FPA at coordinate (x,y) is therefore $$g(x,y) = \int_\Lambda T(x,y-S(\lambda))f_0(x,y-S(\lambda),\lambda)d\lambda, \quad (15)$$

where $S(\lambda)$ is the dispersion function induced by the prism at wavelength $\lambda$. For example, take a scene of spatial dimension M by N and spectral dimension L, i.e., the dimension of the image cube is M×N×L, and the dispersion is along the second spatial dimension y, then the number of measurements captured by the FPA will be M(N+L−1). If the integral in Eqn. (15) is approximated by a discrete summation and the 3D image cube and the 2D measurements are vectorized, then a matrix-vector form of Eqn. (15) is give as:

$$g = Hf_0 + z, \quad (16)$$

where $f_0$ is the vectorized 3D image cube of dimension n=MNL, vectors g and z are the measurements and the additive noise, respectively, and the matrix H is an equivalent linear operator that models the integral in Eqn. (15). With a single shot of CASSI, the number of measurements is m=M(N+L−1), whereas K shots will yield m=KM(N+L−1) measurements. The matrix H in Eqn. (16) accounts for the effects of the coded aperture and the dispersive element.

Figure 8A:
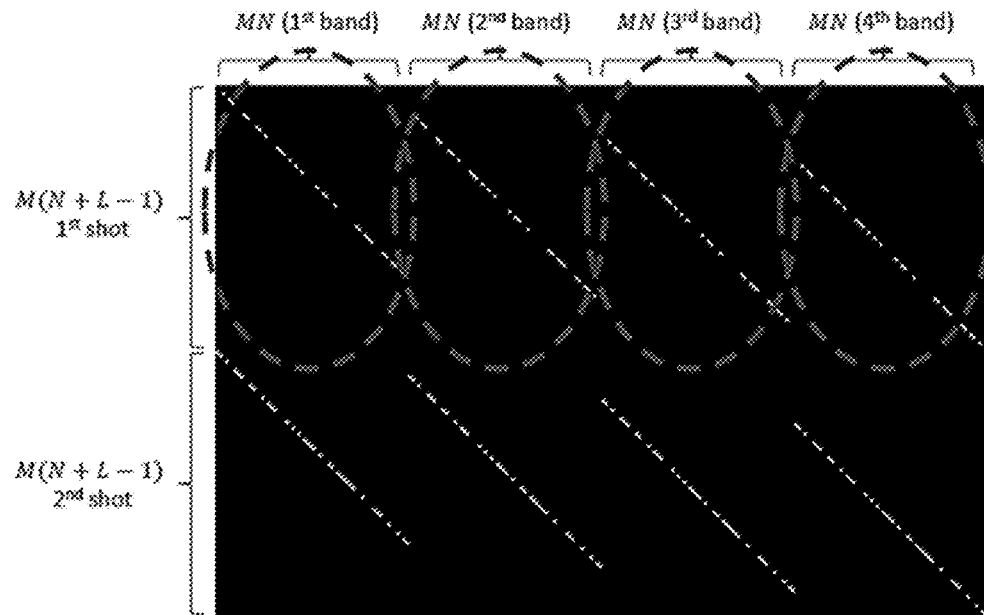
FIGS. 8A and 8B are graphical representations of examples of H matrices for standard and higher order coded aperture snapshot spectral imager (CASSI) in accordance with various embodiments of the present disclosure.
Figure 8B:
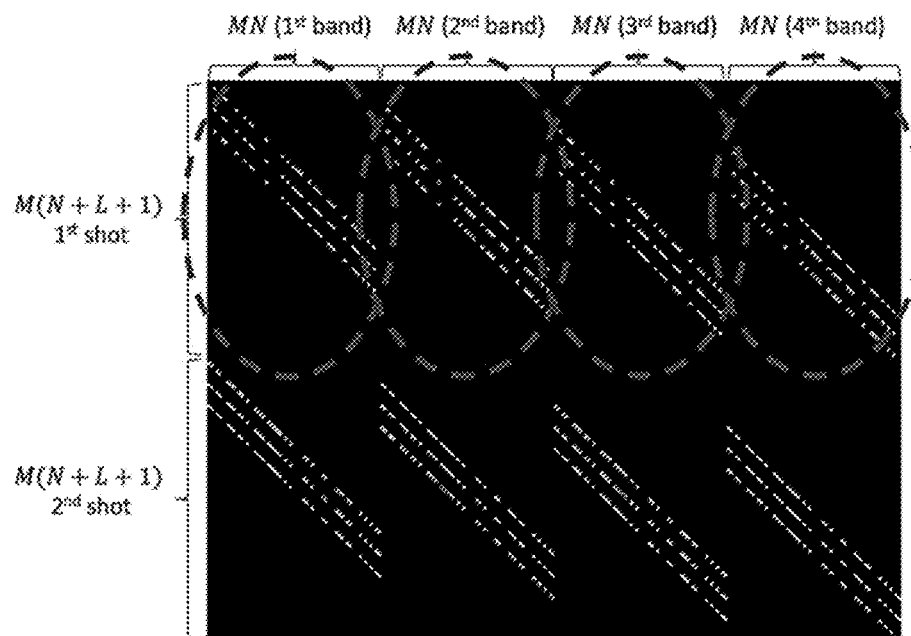

A sketch of this matrix is depicted in FIG. 8A when K=2 shots are used. It includes a set of diagonal patterns that repeat in the horizontal direction, each time with a unit downward shift, as many times as the number of spectral bands. Each diagonal pattern is the coded aperture itself after being column-wise vectorized. Just below, the next set of diagonal patterns are determined by the coded aperture pattern used in the subsequent shot. The matrix H will thus have as many sets of diagonal patterns as FPA measurements. In FIGS. 8A and 8B, the matrix H is presented for K=2, M=N=8, L=4. The circled diagonal patterns that repeat horizontally correspond to the coded aperture pattern used in the first FPA shot. The second coded aperture pattern determines the next set of diagonals. In the standard CASSI of FIG. 8A, each FPA shot captures M(N+L−1)=88 measurements; and in higher order CASSI of FIG. 8B, each FPA shot captures M(N+L+1)=104 measurements.

A higher order model has been proposed to characterize the CASSI system with greater precision, and improved the quality of the reconstructed 3D image cubes. In the standard CASSI system model, each cubic voxel in the 3D cube contributes to exactly one measurement in the FPA. In the higher order CASSI model, however, each cubic voxel is shifted to an oblique voxel because of the continuous nature of the dispersion, and therefore the oblique voxel contributes to more than one measurement in the FPA. As a result, the matrix H in Eqn. (16) will have multiple diagonals as shown in FIG. 8B, where there are sets of 3 diagonals for each FPA shot, accounting for the voxel energy impinging into the neighboring FPA pixels. In this case, the number of measurements with K=1 shot of CASSI will be m=M(N+L+1), because each diagonal entails the use of M more pixels. See "Higher-order computational model for coded aperture spectral imaging" by H. Arguello et al. (Appl. Optics, vol. 52, no. 10, pp. D12-D21, March 2013), which is hereby incorporated by reference in its entirety, for more details. Image reconstruction results for this higher order CASSI system are provided. Using the standard CASSI model, the algorithm produces similar advantageous results over other competing algorithms.

The goal of the algorithm is to reconstruct the image cube $f_0$ from its compressive measurements g, where the matrix H is known. The algorithm employs (i) approximate message passing (AMP), an iterative algorithm for compressive sensing problems, and (ii) adaptive Wiener filtering, a hyperspectral image denoiser that can be applied within each iteration of AMP. The linear imaging system model in Eqn. (16) can be converted to a 3D image denoising problem in scalar channels. Begin by defining scalar channels, where the noisy observations q of the image cube $f_0$ obey:

$$q = f_0 + v, \quad (17)$$

and v is the additive noise vector. Recovering $f_0$ from q is a 3D image denoising problem.

AMP has become a popular algorithm for solving signal reconstruction problems in linear systems as defined in Eqn. (16). The AMP algorithm proceeds iteratively according to:

$$f^{t+1} = \eta_t(H^T r^t + f^t), \quad (18)$$

$$r^t = g - Hf^t + \frac{1}{R}r^{t-1}\langle \eta'_{t-1}(H^T r^{t-1} + f^{t-1})\rangle, \quad (19)$$

where $H^T$ is the transpose of H, R=m/n represents the measurement rate, $\eta_t(.)$ is a denoising function at the t-th iteration, $$\eta'_t(s) = \frac{\partial}{\partial s}\eta_t(s), \text{ and } \langle u \rangle = \frac{1}{n}\sum_{i=1}^{n} u_i$$

for some vector $u=(u_1, u_2, \ldots, u_n)$. The last term in Eqn. (19) is called the "Onsager reaction term" in statistical physics, and this Onsager reaction term helps improve the phase transition (trade-off between the measurement rate and signal sparsity) of the reconstruction process. In the t-th iteration, the vectors $f^t$ and $r^t$ are obtained. The vector $H^T r^t + f^t$ in Eqn. (18) can be regarded as a noise-corrupted version of $f_0$ in the t-th iteration with noise variance $\sigma_t^2$, and therefore is a 3D image denoising function that is performed on a scalar channel as in Eqn. (17). Let the equivalent scalar channel at iteration t be denoted by:

$$q^t = H^T r^t + f^t = f_0 + v^t, \quad (20)$$

Where the noise level $\sigma_t^2$ is estimated by "Graphical models concepts in compressed sensing" by A. Montanari (*Compressed Sensing: Theory and Applications*, pp. 394-438, 2012), which is hereby incorporated by reference in its entirety, $$\hat{\sigma}_t^2 = \frac{1}{m} \sum_{i=1}^{m} (r_i^t)^2, \quad (21)$$

and $r_i^t$ denotes the i-th component of the vector $r^t$ in Eqn. (19).

Adaptive Wiener Filter:

The 3D image denoiser is the function $\eta_t(.)$ in the first step of AMP iterations in Eqn. (19). Recall that in 2D image denoising problems, a 2D wavelet transform is often performed and some shrinkage function is applied to the wavelet coefficients in order to suppress noise. The wavelet transform based image denoising method is effective, because natural images are usually sparse in the wavelet transform domain, there are only a few large wavelet coefficients and the rest of the coefficients are small. Therefore, the large wavelet coefficients are likely to contain information about the image, whereas small coefficients are usually comprised mostly of noise, and so it is effective to denoise by shrinking the small coefficients toward zero and suppressing the large coefficients according to the noise variance. Similarly, in hyperspectral image denoising, a sparsifying transform can be found such that the hyperspectral images have only a few large coefficients in this transform domain. A wavelet transform can be applied to each of the 2D images in a 3D cube, and then a discrete cosine transform (DCT) can be applied along the spectral dimension, because the 2D slices from different wavelengths are highly correlated. That is, the sparsifying transform $\Psi$ can be expressed as a Kronecker product of a DCT transform $\Phi$ and a 2D wavelet transform W, i.e., $\Phi = \psi \otimes W$, and it can easily be shown that $\Psi$ is an orthonormal transform. Our 3D image denoising is processed after applying the sparsifying transform $\Psi$ to the noisy image cube $q^t$.

In the previous compressive imaging reconstruction problems for 2D images, one of the image denoisers that was employed included an adaptive Wiener filter in the wavelet domain, where the variance of each wavelet coefficient was estimated from its neighboring coefficients within a 5×5 window, i.e., the variance was estimated locally. Such an image denoiser performed well in the 2D compressive imaging problem, because the scalar channel of Eqn. (20) obtained from the AMP iterations of Eqns. (18) and (19) was an additive white Gaussian noise channel, and each wavelet coefficient contained independent and identically distributed (i.i.d.) Gaussian noise. In the CASSI system of Eqn. (16), however, because the matrix H is ill-conditioned as shown in FIGS. 8A and 8B, the scalar channel of Eqn. (20) that is produced by AMP iterations is not additive white Gaussian, and the noisy 3D image cube $q^t$ contains non-i.i.d. Gaussian noise. Consequently, estimating the coefficient variance from its small neighboring coefficients (a 3×3 or 5×5 neighboring window) may not be accurate. Therefore, the local variance estimation can be modified to a global estimation within each wavelet subband, and the simulation results show that global estimation provides better reconstruction quality than local estimation for hyperspectral images. Specifically, let $\theta_q^t$ denote the coefficients of $q^t$ in the transform domain, i.e., $\theta_q^t = \Psi q$, and $\theta_{q,i}^t$ is the i-th element of $\theta_q^t$. The coefficients $\theta_f^t$ of the estimated (denoised) image cube $f^t$ are obtained by Wiener filtering, $$\hat{\theta}_{f,i}^t = \frac{\max\{0, \hat{\sigma}_{i,t}^2 - \sigma_t^2\}}{(\hat{\sigma}_{i,t}^2 - \sigma_t^2) + \sigma_t^2}(\theta_{q,i}^t - \hat{\mu}_{i,t}) + \hat{\mu}_{i,t} \quad (22)$$

$$= \frac{\max\{0, \hat{\sigma}_{i,t}^2 - \sigma_t^2\}}{\hat{\sigma}_{i,t}^2}(\theta_{q,i}^t - \hat{\mu}_{i,t}) + \hat{\mu}_{i,t},$$

where $\hat{\mu}_{i,t}$ and $\hat{\sigma}_{i,t}^2$, are the empirical mean and variance of $\theta_{q,i}^t$ within an appropriate wavelet subband, respectively. Taking the maximum between 0 and $(\hat{\sigma}_{i,t}^2 - \sigma_t^2)$ ensures that if the empirical variance $\hat{\sigma}_{i,t}^2$ of the noisy coefficients is smaller than the noise variance $\sigma_t^2$, then the corresponding noisy coefficients are set to 0. After obtaining the denoised coefficients $\hat{\theta}_f^t$, the estimated image cube in the t-th iteration satisfies $f^t = \Psi^{-1}\hat{\theta}_f^t = \Psi^T \hat{\theta}_f^t$.

The adaptive Wiener filter can be applied in Eqn. (18) as the 3D image denoising function $\eta_t(.)$. The following step in Eqn. (19) utilizes $\eta_t'(.)$, i.e., the derivative of $\eta_t(.)$. How to obtain $\eta_t'(.)$ is now shown. It has been discussed that when the sparsifying transform is orthonormal, the derivative calculated in the transform domain is equivalent to the derivative in the image domain. According to Eqn. (22), the derivative of the Wiener filter in the transform domain with respect to $\hat{\theta}_{q,i}^t$ is max $\{0, \hat{\sigma}_{i,t}^2 - \sigma_t^2\}/\hat{\sigma}_{i,t}^2$. Because the sparsifying transform $\hat{\sigma}_{i,t}^2$ is orthonormal, the Onsager term in Eqn. (19) can be calculated efficiently as $$\langle \eta_t'(H^T r^t + f^t) \rangle = \frac{1}{n} \sum_{i \in \mathcal{J}} \frac{\max\{0, \hat{\sigma}_{i,t}^2 - \sigma_t^2\}}{\hat{\sigma}_{i,t}^2}, \quad (23)$$

where $\mathcal{J}$ is the index set of all image cube elements, and the cardinality of $\mathcal{J}$ is n=MNL.

Focusing on image denoising in an orthonormal transform domain and applying Wiener filtering to suppress noise, it is convenient to obtain the Onsager correction term in Eqn. (19). On the other hand, other denoisers that are not wavelet-DCT based can also be applied within the AMP framework. For example, a block matching and 3D filtering denoising scheme (BM3D) can be utilized within AMP for 2D compressive imaging reconstruction, and run Monte Carlo to estimate the Onsager correction term. However, the Monte Carlo technique is accurate only when the scalar channel of Eqn. (20) is Gaussian. In the CASSI system model of Eqn. (16), BM4D may be an option for the 3D image denoising procedure. However, because the matrix H is ill-conditioned, the scalar channel of Eqn. (20) that is produced by AMP iterations of Eqns. (18) and (19) is not Gaussian, and thus the Monte Carlo technique fails to estimate the Onsager correction term.

Basic AMP has been proved to converge with i.i.d. Gaussian matrices. Other AMP variants have been proposed in order to encourage convergence for a broader class of measurement matrices. The matrix H defined in Eqn. (16) is not i.i.d. Gaussian, but highly structured as shown in FIGS. 8A and 8B. Unfortunately, AMP-Wiener encounters divergence issues with this matrix H. The divergence issues of AMP-Wiener can be detected by evaluating the value of $\hat{\sigma}_t^2$ obtained by Eqn. (21) as a function of iteration number t. Recall that $\hat{\sigma}_t^2$ estimates the amount of noise in the noisy image cube $q^t$ at iteration t. If AMP-Wiener converges, then the value of $\hat{\sigma}_t^2$ is expected to decrease as t increases. Otherwise, AMP-Wiener diverges. We choose to apply "damping" to solve for the divergence problems of AMP-Wiener, because it is simple and only increases the runtime modestly. Specifically, damping is an extra step within AMP iterations. In Eqn. (18), instead of updating the value of $f^{t+1}$ by the output of the denoiser $\eta_t(H^T r^t + f^t)$, we assign a weighted average of $\eta_t(H^T r^t + f^t)$ and $f^t$ to $f^{t+1}$ as follows:

$$f^{t+1} = \alpha \cdot \eta_t(H^T r^t + f^t) + (1-\alpha) \cdot f^t, \quad (24)$$

for some constant $0 < \alpha \leq 1$. Similarly, after obtaining $r^t$ in Eqn. (19), an extra damping step is added:

$$r^t = \alpha \cdot r^t + (1-\alpha) \cdot r^{t-1}, \quad (25)$$

with the same value of $\alpha$ as that in Eqn. (24).

The AMP-Wiener is summarized in Algorithm 1, where $\hat{f}_{AMP}$ denotes the image cube reconstructed by AMP-Wiener. Note that in the first iteration of Algorithm 1, initialization of $q^0$ and $\hat{\sigma}_0^2$ may not be needed, because $r^0$ is an all-zero vector, and the Onsager term is 0 at iteration 1.

---

Algorithm 1 AMP-Wiener

---

Inputs: g, H, α, maxIter
Outputs: $\hat{f}_{AMP}$
Initialization: $f^1 = 0$, $r^0 = 0$
for t = 1: maxIter do 1) $r^t = g - Hf^t + \frac{1}{R} r^{t-1} \frac{1}{n} \sum_{i=1}^{n} \frac{\max\{0, \hat{\sigma}_{i,t-1}^2 - \sigma_{t-1}^2\}}{\hat{\sigma}_{i,t-1}^2}$ 2) $r^t = \alpha \cdot r^t + (1-\alpha) \cdot r^{t-1}$ 3) $q^t = H^T r^t + f^t$ 4) $\hat{\sigma}_t^2 = \frac{1}{m} \sum_j (r_j^t)^2$ 5) $\theta_q^t = \Psi q^t$ 6) $\hat{\theta}_{f,i}^t = \frac{\max\{0, \hat{\sigma}_{i,t}^2 - \sigma_t^2\}}{\hat{\sigma}_{i,t}^2} (\theta_{q,i}^t - \hat{\mu}_{i,t}) + \hat{\mu}_{i,t}$ 7) $f^{t+1} = \alpha \cdot \Psi^T \hat{\theta}_f^t + (1-\alpha) \cdot f^t$ end for
$\hat{f}_{AMP} = f^{maxIter+1}$

---

Numerical Results

In this section, numerical results comparing the reconstruction quality and runtime of AMP-Wiener, gradient projection for sparse reconstruction (GPSR), and two-step iterative shrinkage/thresholding (TWIST). In all experiments, the same coded aperture pattern was used for AMP-Wiener, GPSR, and TwIST. In order to qualify the reconstruction quality of each algorithm, the peak signal to noise ratio (PSNR) of each 2D slice in reconstructed cubes is measured. The PSNR is defined as the ratio between the maximum squared value of the ground truth image cube $f_0$ and the mean square error of the estimation $\hat{f}$, as given by:

$$PSNR = 10 \cdot \log_{10} \left( \frac{\max_{x,y,\lambda} \{f_{0,(x,y,\lambda)}^2\}}{\sum_{x,y,\lambda} \left(\hat{f}_{(x,y,\lambda)} - f_{0,(x,y,\lambda)}\right)^2} \right),$$

where $f_{(x,y,\lambda)}$ denotes the element in the cube f at spatial coordinate (x,y) and spectral coordinate $\lambda$.

In AMP, the damping parameter $\alpha$ was set to be 0.2. Other damping values are possible, but for smaller values such as 0.1, the reconstruction quality improves more slowly as the iteration number increases; for larger values such as 0.5, AMP may diverge. Recall that the amount of damping can be adjusted by evaluating the values of $\hat{\sigma}_t^2$ from Eqn. (21). The choice of damping mainly depends on the structure of the imaging model in Eqn. (16) but not on the characteristics of the image cubes, and thus the value of the damping parameter $\alpha$ need not be tuned in our experiments.

To reconstruct the image cube $f_0$, GPSR and TwIST minimize objective functions of the form:

$$\hat{f} = \arg\min_f 1/2 \|g - Hf\|_2^2 + \beta \cdot \phi(f), \quad (26)$$

where $\phi(.)$ is a regularization function that characterizes the structure of the image cube $f_0$, and $\beta$ is a regularization parameter that balances the weights of the two terms in the objective function. In GPSR, $\phi(f) = \|\Psi f\|_1$; in TwIST, the total variation regularizer is employed:

$$\phi(f) \Sigma_{\lambda=1}^{L} \Sigma_{x=1}^{M} \Sigma_{y=1}^{N} ((f(x+1,y,\lambda) - f(x,y,\lambda))^2 + (f(x,y+1,\lambda) - f(x,y,\lambda))^2)^{1/2}. \quad (27)$$

The value of the regularization parameter $\beta$ in Eqn. (26) greatly affects the reconstruction results of GPSR and TwIST, and must be tuned carefully. The optimal values of $\beta$ were selected for GPSR and TwIST manually, and GPSR and TwIST run with 5-10 different values of $\beta$, and the results selected with the highest PSNR. The typical value of regularization parameter for GPSR was between $10^{-5}$ and $10^{-4}$, and the value for TwIST was around 0.1. Note that the ground truth image cube is not known in practice, and estimating the PSNR obtained using different $\beta$ may be quite involved and utilize oracle-like information when using GPSR and TwIST. There exist other hyperspectral image reconstruction algorithms based on dictionary learning. However, it is not straightforward to modify these dictionary learning methods to the higher order CASSI model, and so these algorithms were not included in the comparison.

Figure 9:
FIG. 9 is an example of a hyperspectral image of a scene in accordance with various embodiments of the present disclosure.

The first set of simulations was done using a cube of the scene shown In FIG. 9. This data cube was acquired using a wide-band Xenon lamp as the illumination source, modulated by a visible monochromator spanning the spectral range between 448 nm and 664 nm, and each waveband has 9 nm width. The image intensity was captured using a grayscale CCD camera, with pixel size 9.9 pm, and 8 bits of intensity levels. The resulting test data cube has M×N=256× 256 pixels of spatial resolution and L=24 spectral bands.

Setting 1: The measurements g are captured with K=2 shots such that the coded aperture in the second shot is the complement of the aperture in the first shot. To ensure that in the matrix H in Eqn. (16), the norm of each column is similar. The measurement rate with two shots is m/n=KM (N+L+1)/(MNL)<0.09. Moreover, Gaussian noise with zero mean was added to the measurements. The signal to noise ratio (SNR) is defined as $10_{log_{10}}(\mu_g/\sigma_{noise})$, where $\mu_g$ is the mean value of the measurements $Hf_0$ and $\sigma_{noise}$ is the standard deviation of the additive noise z. In setting 1, measurement noise was added such that the SNR is 20 dB.

Figure 10:
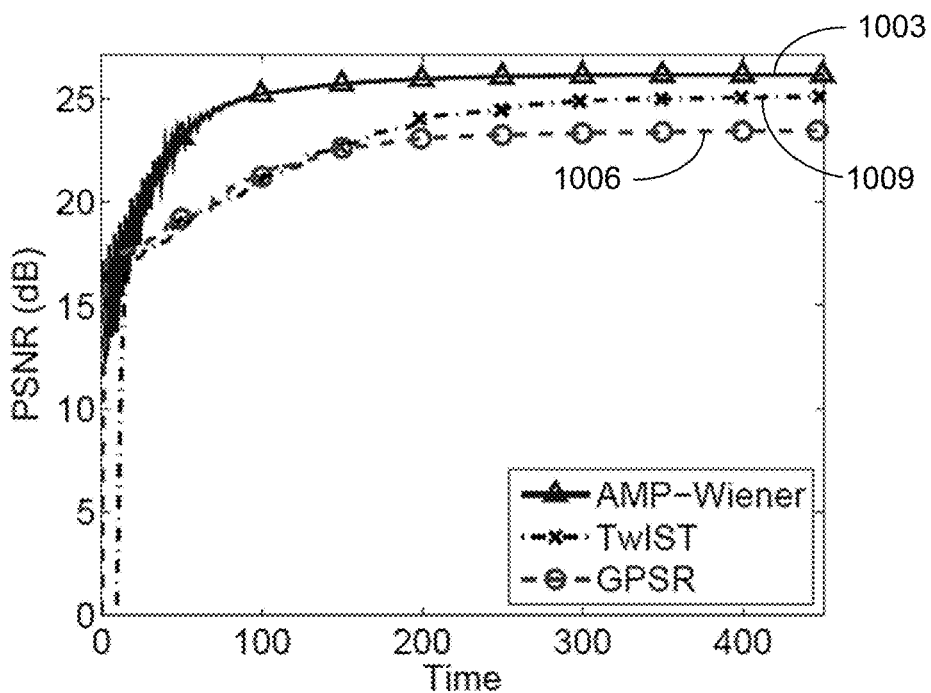
FIGS. 10 and 11 are examples of runtime and spectral band with respect to average peak signal to noise ratio (PSNR) in accordance with various embodiments of the present disclosure.

FIG. 10 compares the reconstruction quality of AMP-Wiener, GPSR, and TwIST within a certain amount of runtime for the image cube of FIG. 9. Runtime was measured on a Dell OPTIPLEX 9010 running an Intel® Core™ i7-860 with 16 GB RAM, and the environment was Matlab R2013a. The cube size was M=N=256, and L=24. The measurements were captured with K=2 shots using complementary coded apertures, and the number of measurements was m=143,872. Random Gaussian noise was added to the measurements such that the SNR was 20 dB.

Figure 11:
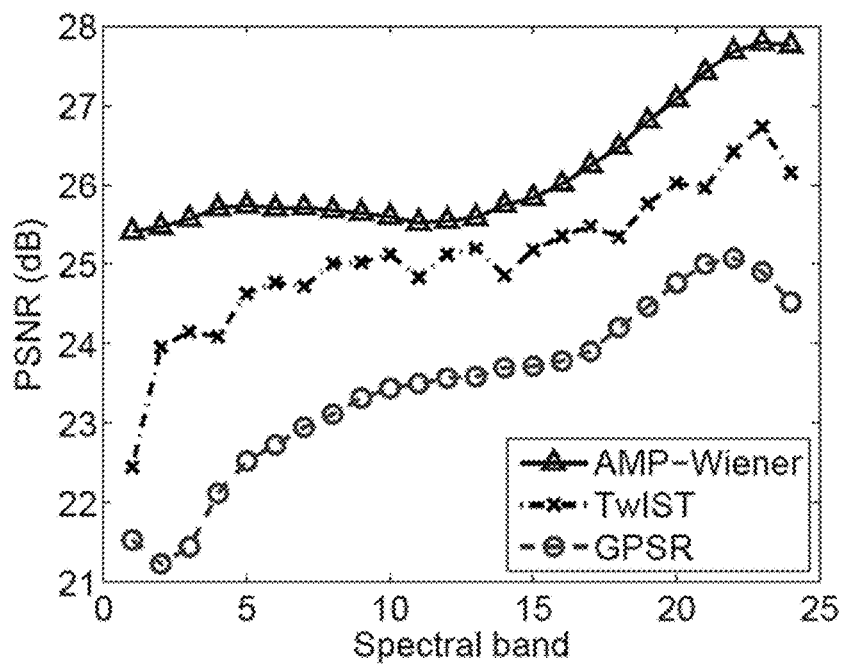

In FIG. 10, the horizontal axis represents runtime in seconds, and the vertical axis is the averaged PSNR over the 24 spectral bands. Although the PSNR of AMP-Wiener oscillates at the first few iterations, which may be because the matrix H is ill-conditioned, it becomes stable after 50 seconds and reaches a higher level when compared to the PSNRs of GPSR and TwIST at 50 seconds. After 450 seconds, the average PSNR of the cube reconstructed by AMP-Wiener (solid curve 1003) is 26.16 dB, while the average PSNRs of GPSR (dash curve 1006) and TwIST (dash-dotted curve 1009) are 23.46 dB and 25.10 dB, respectively. Note that in 450 seconds, TwIST runs around 200 iterations, while AMP-Wiener and GPSR run 400 iterations. FIG. 11 complements FIG. 10 by illustrating the PSNR of each 2D slice in the reconstructed cube separately. It is shown that the cube reconstructed by AMP-Wiener has 2-4 dB higher PSNR than the cubes reconstructed by GPSR and 0.4-3 dB higher than that of TwIST for all 24 slices.

Figure 12:
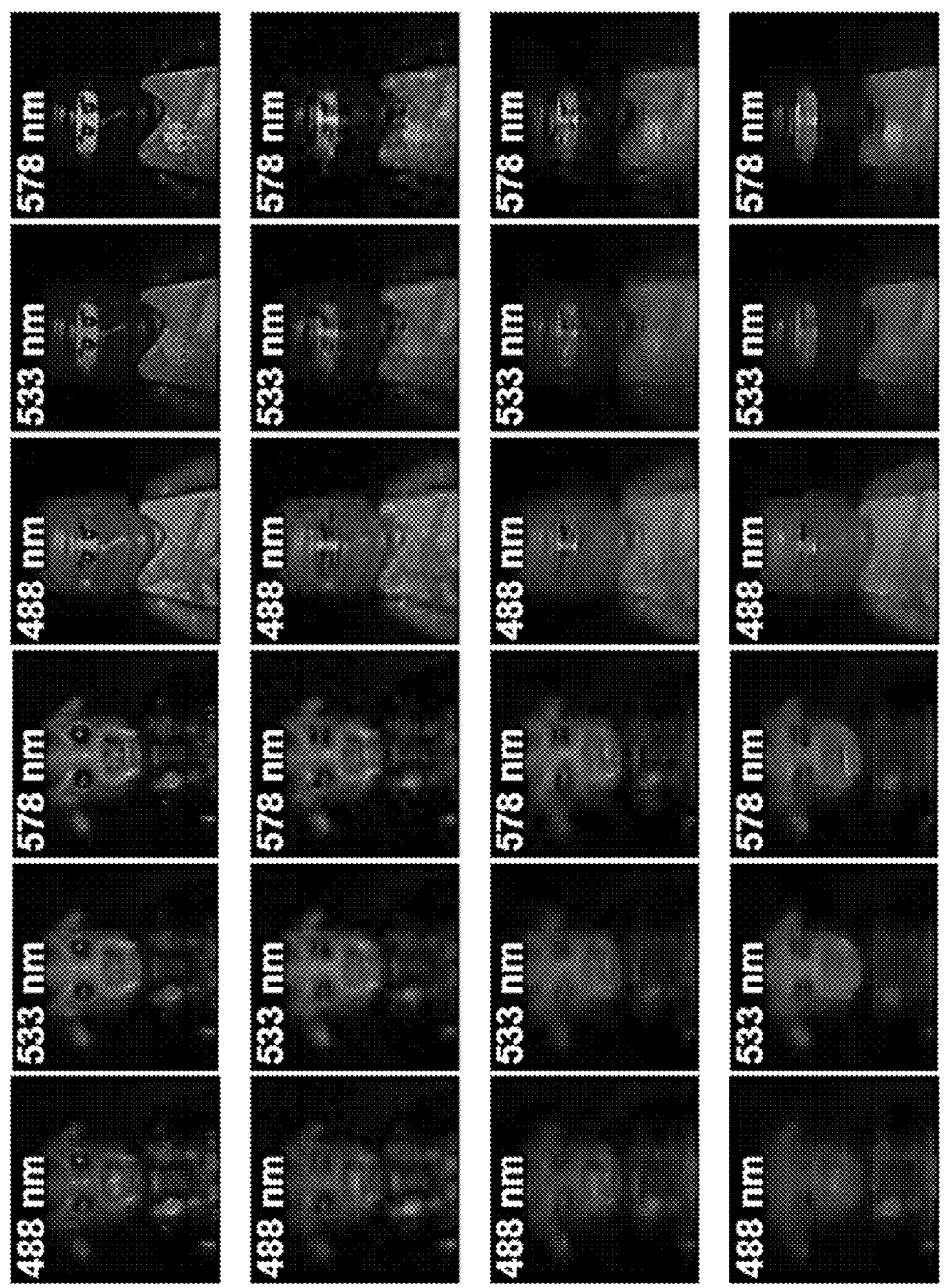
FIG. 12 is an example of hyperspectral images of figurines in accordance with various embodiments of the present disclosure.

In FIG. 12, 2D slices are plotted at wavelengths of 488 nm, 533 nm, and 578 nm in the actual image cubes from FIG. 9 reconstructed by AMP-Wiener, GPSR, and TwIST. The cube size was M=N=256, and L=24. The measurements were captured with K=2 shots using complementary coded apertures, and the number of measurements was m=143,872. Random Gaussian noise was added to the measurements such that the SNR is 20 dB. The images in these four rows are slices from the ground truth image cube $f_0$, and the cubes reconstructed by AMP-Wiener, GPSR, and TwIST, respectively. The first row corresponds to ground truth, the second row corresponds to the reconstruction result by AMP-Wiener, the third row corresponds to the reconstruction result by GPSR, and the last row corresponds to the reconstruction result by TwIST. At the same time, the images in columns 1-3 show the upper-left part of the scene of FIG. 9, whereas images in columns 4-6 show the upper-right part of the scene of FIG. 9. Columns 1-3 correspond to the upper-left part of the scene of size 128×128 and columns 4-6 correspond to the upper-right part of the scene of size 128×128. All images are of size 128×128. From FIG. 12, it can be seen that the 2D slices reconstructed by AMP-Wiener have better visual quality; the slices reconstructed by GPSR have blurry edges, and the slices reconstructed by TwIST lack details because the total variation regularization tends to constrain the images to be piecewise constant.

Figure 13A:
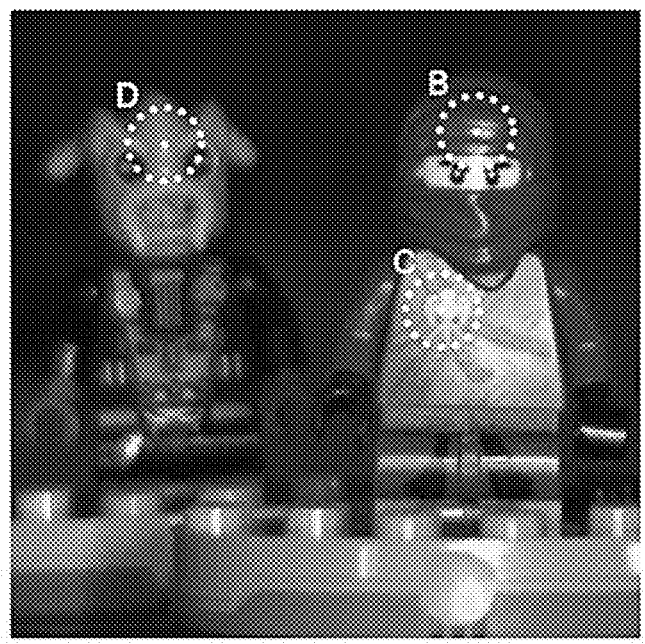
FIG. 13A is an image indicating three pixel locations of reconstruction in accordance with various embodiments of the present disclosure.
Figure 13B:
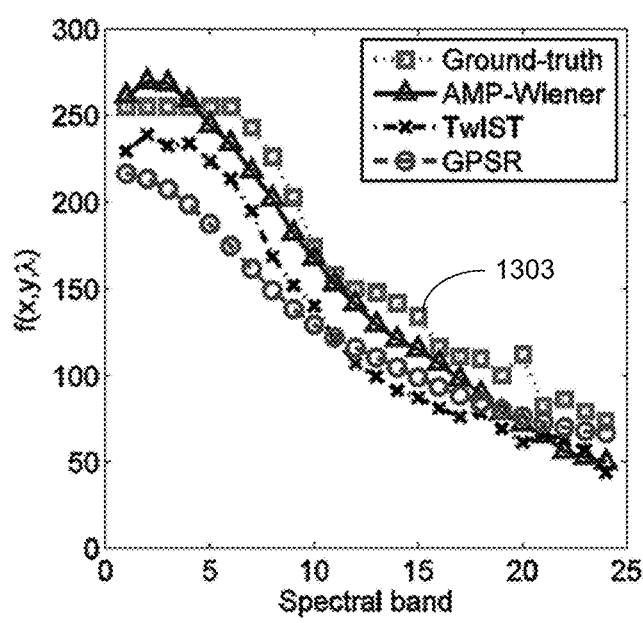
FIGS. 13B-13D are comparisons of estimated pixel values using AMP-Wierner, gradient projection for sparse reconstruction (GPSR) and two-step iterative shrinkage/thresholding (TwIST) reconstruction for the three pixel locations of FIG. 13A in accordance with various embodiments of the present disclosure.
Figure 13C:
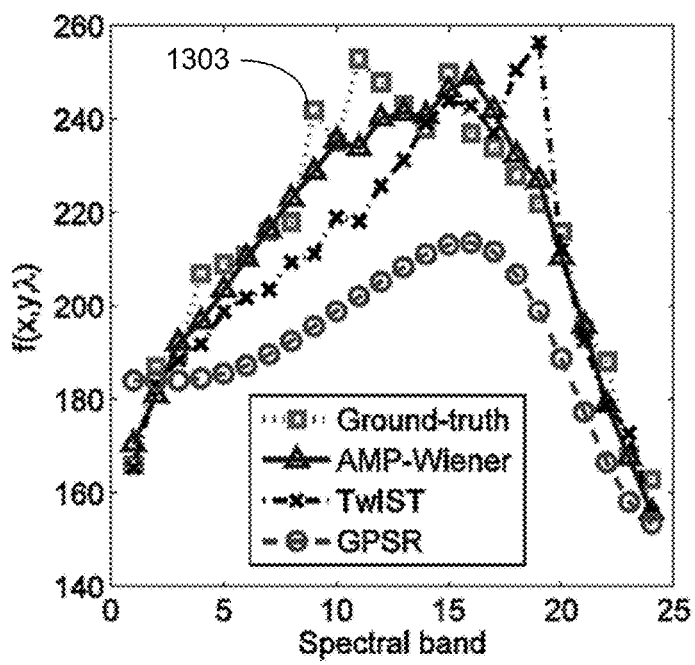
Figure 13D:
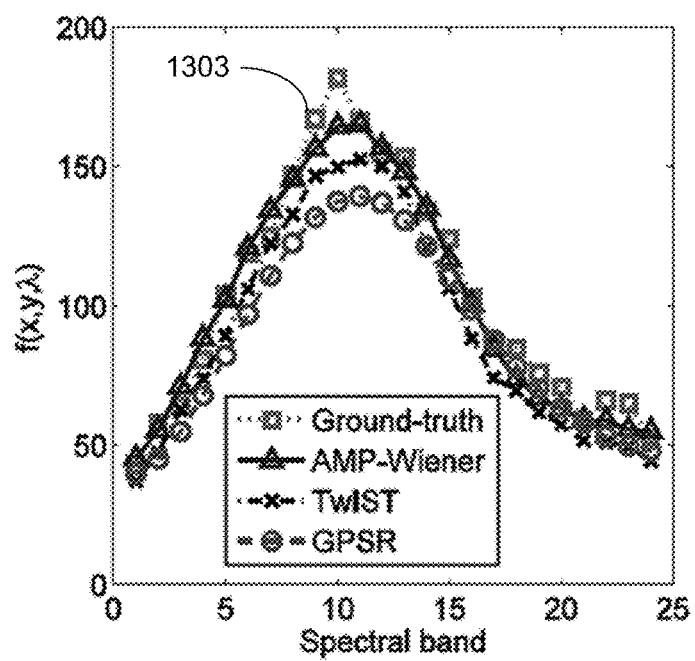

Furthermore, a spectral signature plot was used to analyze how the pixel values change along the spectral dimension at a fixed spatial location. Examples of spectral signature plots for the image cubes reconstructed by AMP-Wiener, GPSR, and TwIST are illustrated in FIGS. 13A-13D. Three spatial locations are selected as shown in FIG. 13A, and the spectral signature plots for locations B, C and D are shown in FIGS. 13B, 13C and 13D, respectively. It can be seen that the spectral signatures of the cube reconstructed by AMP-Wiener closely resemble those of the ground truth image cube (dotted curve 1303), whereas there are obvious discrepancies between the spectral signatures of the cube reconstructed by GPSR or TwIST and those of the ground truth cube.

According to the runtime experiment from setting 1, AMP-Wiener was run with 400 iterations, GPSR was run with 400 iterations, and TwIST was run with 200 iterations for the rest of the simulations, so that all algorithms complete within the same amount of time.

Figure 14:
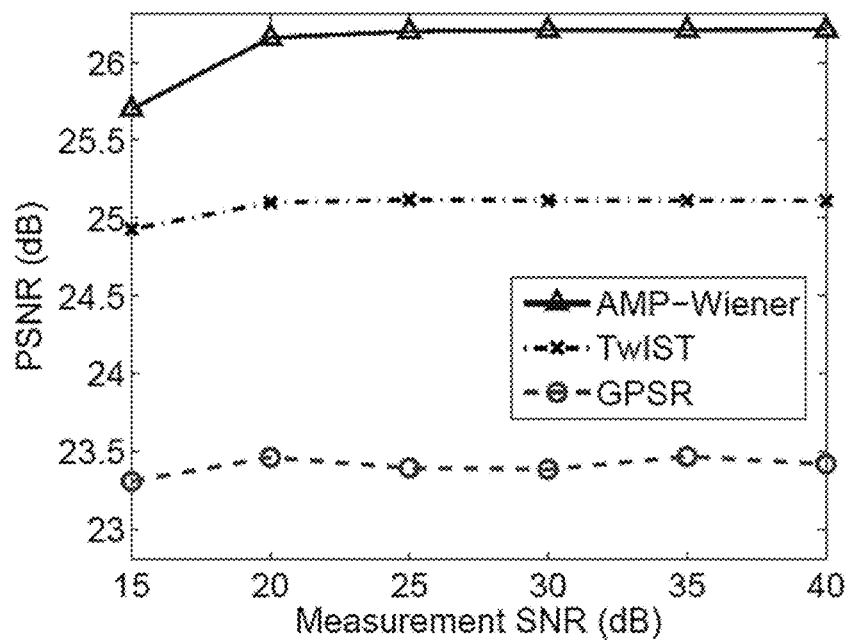
FIGS. 14 and 15 are plots of examples of measurement noise and number of shots with respect to average peak signal to noise ratio (PSNR) in accordance with various embodiments of the present disclosure.

Setting 2: In this experiment, measurement noise was added such that the SNR varied from 15 dB to 40 dB, and the measurement noise versus average PSNR comparison of AMP-Wiener, GPSR, and TwIST for the image cube of FIG. 9 is shown in FIG. 14. Cube size was M=N=256, and L=24. The measurements were captured with K=2 shots using complementary coded apertures, and the number of measurements was m=143,872. Again, AMP-Wiener achieves more than 2 dB higher PSNR than GPSR, and about 1 dB higher PSNR than TwIST, overall.

Figure 15:
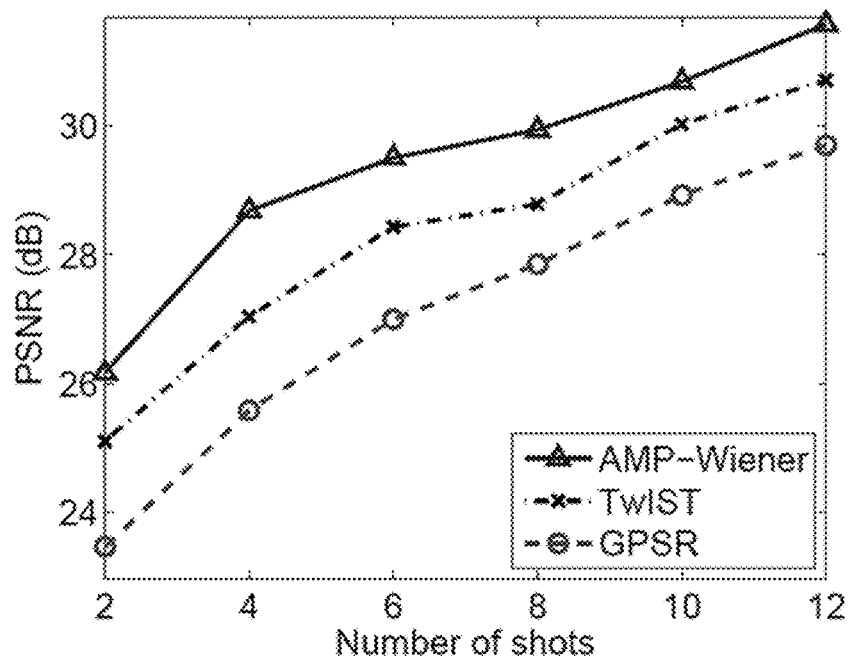

Setting 3: In settings 1 and 2, the measurements are captured with K=2 shots. The algorithm was tested on the setting where the number of shots varies from K=2 to K=12 with pairwise complementary coded apertures. The coded aperture was randomly generated for the k-th shot for k=1,3,5,7,9,11, and the coded aperture in the (k+1)-th shot is the complement of the aperture in the k-th shot. In this setting, a moderate amount of noise (20 dB) was added to the measurements. FIG. 15 presents the PSNR changes of the reconstructed cubes as the number of shots increases, and AMP-Wiener consistently beats GPSR and TwIST. Cube size was M=N=256, and L=24. The measurements were captured with K=2 shots using complementary coded apertures, and the number of measurements was m=143,872.

Figure 16:
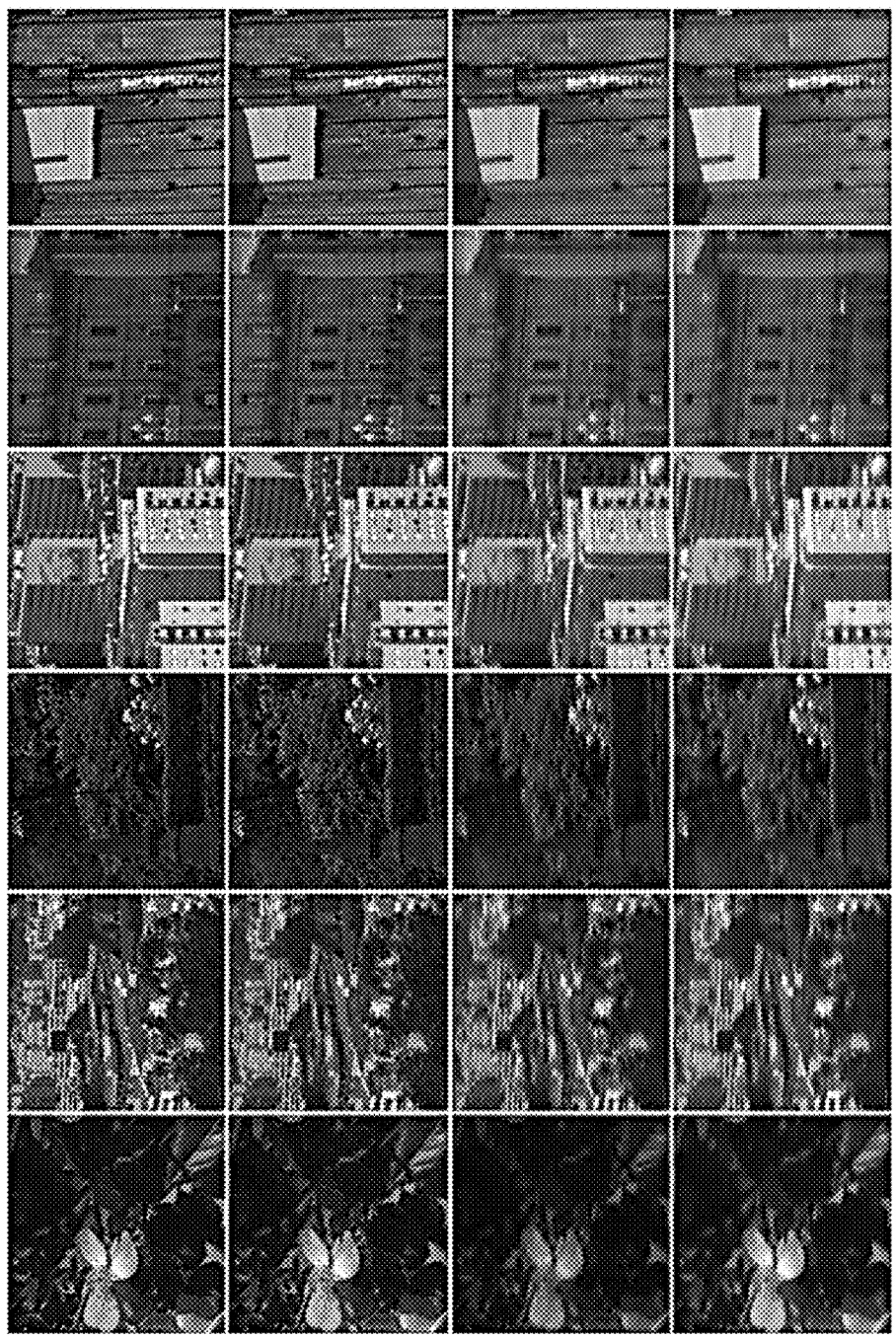
FIG. 16 illustrates examples of selected image cubes images reconstructed by AMP-Wierner, GPSR and TwIST in accordance with various embodiments of the present disclosure.

Besides the image cube of FIG. 9, the algorithm was also tested on image cubes of natural scenes. There were two datasets, "natural scenes 2002" and "natural scenes 2004," each one with 8 image data cubes. The cubes in the first dataset have L=31 spectral bands with spatial resolution of around 700×700, whereas the cubes in the second dataset have L=33 spectral bands with spatial resolution of around 1000×1000. To satisfy the dyadic constraint of the 2D wavelet, their spatial resolution was cropped to be M=N=512. FIG. 16 shows a comparison of selected image cubes reconstructed by AMP-Wiener, GPSR, and TwIST for the datasets "natural scene 2002" and "natural scene 2004." The 2D RGB images shown in FIG. 16 were converted from their corresponding 3D image cubes. Cube size was M=N=512, and L=31 for images in columns 1-2 or L=33 for images in columns 3-6. Random Gaussian noise was added to the measurements such that the SNR is 20 dB. The first row corresponds to ground truth, the second row corresponds to the reconstruction result by AMP-Wiener, the third row corresponds to the reconstruction result by GPSR, and the last row corresponds to the reconstruction result by TwIST.

The measurements were captured with K=2 shots, and the measurement rate is m/n=KM(N+L+1)/(MNL) 0.069 for "natural scene 2002" and 0.065 for "natural scene 2004." Measurement noise levels were tested such that the SNRs were 15 dB and 20 dB. The typical runtimes for AMP with 400 iterations, GPSR with 400 iterations, and TwIST with 200 iterations were approximately 2,800 seconds. The average PSNR over all spectral bands for each reconstructed cube is shown in TABLES 3 and 4. TABLE 3 provides the average PSNR comparison of AMP-Wiener, GPSR, and TwIST for the dataset "natural scene 2002." The spatial dimensions of the cubes were cropped to M=N=512, and each cube has L=31 spectral bands. The measurements were captured with K=2 shots, and the number of measurements is m=557,056. Random Gaussian noise was added to the measurements such that the SNR was 15 or 20 dB. TABLE 4 provides the average PSNR comparison of AMP-Wiener, GPSR, and TwIST for the dataset "natural scene 2004." The spatial dimensions of the cubes were cropped to M=N=512, and each cube has L=33 spectral bands. The measurements were captured with K=2 shots, and the number of measurements is m=559,104. Random Gaussian noise was added to the measurements such that the SNR was 15 or 20 dB.

TABLE 3

|  | 15 dB | | | 20 dB | | |
| --- | --- | --- | --- | --- | --- | --- |
|  | AMP | GPSR | TwIST | AMP | GPSR | TwIST |
| Scene 1 | 32.69 | 28.10 | 31.05 | 33.29 | 28.09 | 31.16 |
| Scene 2 | 26.52 | 24.32 | 26.25 | 26.65 | 24.40 | 26.41 |
| Scene 3 | 32.05 | 29.33 | 31.21 | 32.45 | 29.55 | 31.54 |
| Scene 4 | 27.57 | 25.19 | 27.17 | 27.76 | 25.47 | 27.70 |
| Scene 5 | 29.68 | 27.09 | 29.07 | 29.80 | 27.29 | 29.42 |
| Scene 8 | 28.72 | 25.53 | 26.24 | 29.33 | 25.77 | 26.46 |

TABLE 4

|  | 15 dB | | | 20 dB | | |
| --- | --- | --- | --- | --- | --- | --- |
|  | AMP | GPSR | TwIST | AMP | GPSR | TwIST |
| Scene 1 | 30.48 | 28.43 | 30.17 | 30.37 | 28.53 | 30.31 |
| Scene 2 | 27.34 | 24.71 | 27.03 | 27.81 | 24.87 | 27.35 |
| Scene 3 | 33.13 | 29.38 | 31.69 | 33.12 | 29.44 | 31.75 |
| Scene 4 | 32.07 | 26.99 | 31.69 | 32.14 | 27.25 | 32.08 |
| Scene 5 | 27.44 | 24.25 | 26.48 | 27.83 | 24.60 | 26.85 |
| Scene 6 | 29.15 | 24.99 | 25.74 | 30.00 | 25.53 | 26.15 |
| Scene 7 | 36.35 | 33.09 | 33.59 | 37.11 | 33.55 | 34.05 |
| Scene 8 | 32.12 | 28.14 | 28.22 | 32.93 | 28.82 | 28.69 |

The highest PSNR is highlighted among AMP-Wiener, GPSR, and TwIST using bold fonts. It can be seen from TABLES 3 and 4 that AMP-Wiener usually outperforms GPSR by 2-5 dB in terms of the PSNR, and outperforms TwIST by 0.2-4 dB. In addition, the results of six selected image cubes are displayed in FIG. 16 in the form of 2D RGB images. The four rows of images correspond to ground truth, results by AMP-Wiener, results by GPSR, and results by TwIST, respectively. It can be seen from FIG. 16 that AMP-Wiener produces images with better quality, while images reconstructed by GPSR and TwIST are blurrier.

In this disclosure, the compressive hyperspectral imaging reconstruction problem was considered for the coded aperture snapshot spectral imager (CASSI) system. Considering that the CASSI system is a great improvement in terms of imaging quality and acquisition speed over conventional spectral imaging techniques, it is desirable to further improve CASSI by accelerating the 3D image cube reconstruction process. The AMP-Wiener used an adaptive Wiener filter as a 3D image denoiser within the approximate message passing (AMP) framework. AMP-Wiener was shown to be faster than existing image cube reconstruction algorithms, and also achieved better reconstruction quality.

In AMP, the derivative of the image denoiser is utilized, and the adaptive Wiener filter can be expressed in closed form using a simple formula, and so its derivative is easy to compute. Although the matrix that models the CASSI system is ill-conditioned and may cause AMP to diverge, we helped AMP converge using damping, and reconstructed 3D image cubes successfully. Numerical results showed that AMP-Wiener is robust and fast, and outperforms gradient projection for sparse reconstruction (GPSR) and two-step iterative shrinkage/thresholding (TwIST) even when the regularization parameters for GPSR and TwIST are optimally tuned. Moreover, a significant advantage over GPSR and TwIST is that AMP-Wiener need not tune any parameters, and thus an image cube can be reconstructed by running AMP-Wiener only once, which is important in real-world scenarios. In contrast, GPSR and TwIST is run multiple times in order to find the optimal regularization parameters.

In the AMP-Wiener algorithm for compressive hyperspectral imaging reconstruction, the noise variance of the noisy image cube was estimated within each AMP iteration using Eqn. (21). In order to denoise the noisy image cube in the sparsifying transform domain, the estimated noise variance value was applied to all wavelet subbands. The noise variance estimation and 3D image denoising method were effective, and helped produce promising reconstruction. However, both the noise variance estimation and the 3D image denoising method may be sub-optimal, because the noisy image cube within each AMP iteration does not contain i.i.d. Gaussian noise, and so the coefficients in the different wavelet subbands may contain different amounts of noise. Therefore, the denoising part of the proposed algorithm, including the noise variance estimation, may be improved.

Example of Imaging System

Figure 17:
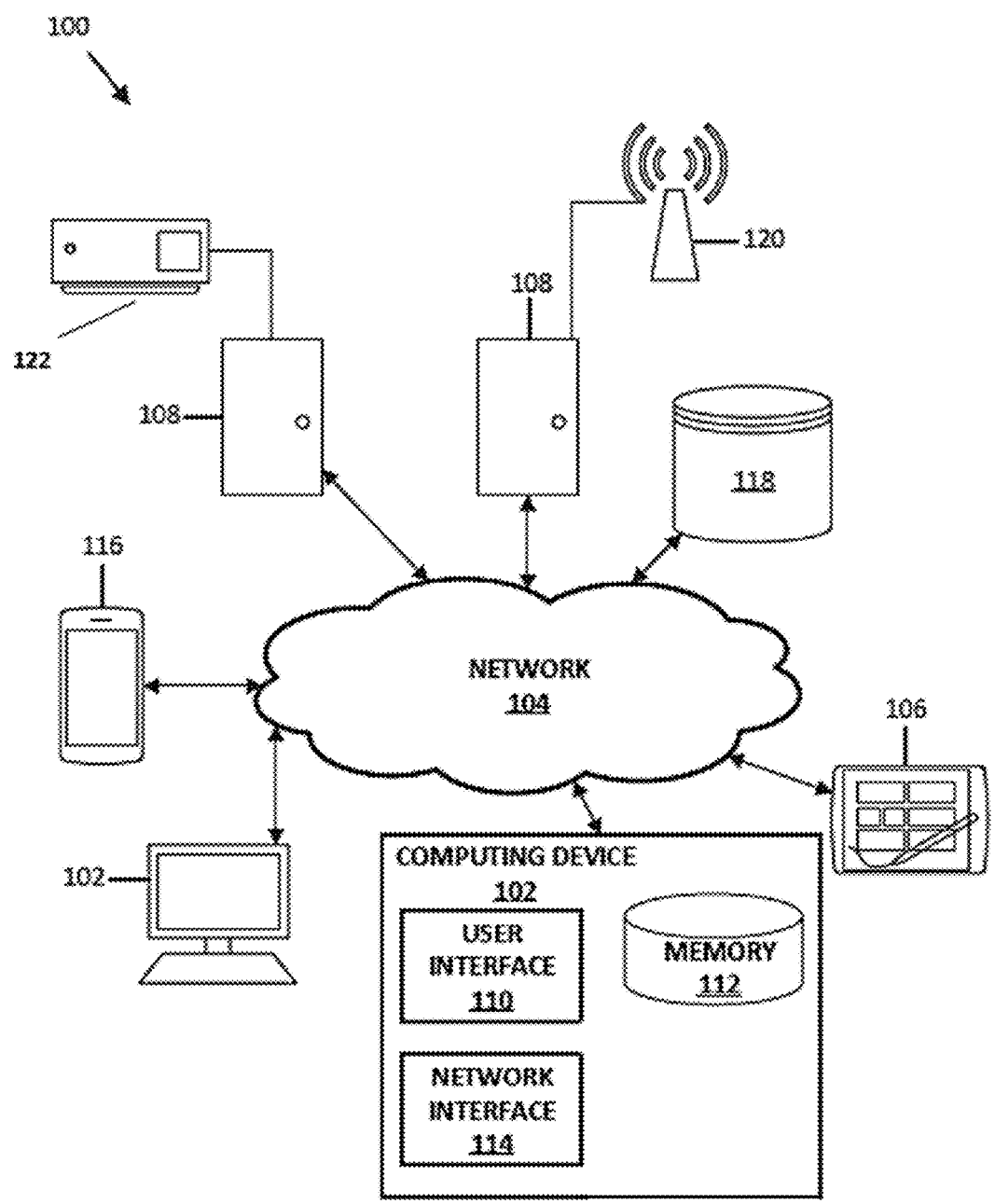
FIG. 17 is a block diagram of an example of a system for compressive imaging using approximate message passing with denoising in accordance with various embodiments of the present disclosure.

FIG. 17 illustrates a block diagram of an example of a system 100 according to embodiments of the present invention. The system 100 may be implemented in whole or in part in any suitable environment. The computing devices 102 may each be communicatively connected via a communications network 104, which may be any suitable local area network (LAN), either wireless (e.g., BLUETOOTH® communication technology) and/or wired. The computing device 102, a tablet device 106 in communication with one of the computing devices 102, and other components, not shown, may be configured to acquire data within the imaging environment, to process the data, and to communicate the data to a centralized server 108. For example, the computing device 102 and its tablet device 106 may operate together to implement imaging analysis function and to communicate data related thereto to the server 108 using a user interface 110.

The components of the system 100 may each include hardware, software, firmware, or combinations thereof. For example, software residing in memory of a respective component may include instructions implemented by a processor for carrying out functions disclosed herein. The computing device 102 may also include memory 112. The computing device 102 may also include a suitable network interface 114 for communicating with the network 104. The tablet device 106 may include hardware (e.g., image capture devices, scanners, and the like) for capture of various data within the retail environment. For example, the tablet device 106 may include an image capture device (e.g., a camera) for capturing one or more images. The system 100 may also include a smart phone device 116 configured with functionality similar to the tablet device 106. The system 100 may also include a database 118 for storage of images, video and other similar data. Further, for example, the server 108 may be connected to the computing devices 102 via the network 104 or via a wireless network 120. A medical device 122 may also be coupled either to the server 108 or alternatively to any other appropriately configured device. The medical device 122 may be configured for patient imaging as an example.

As illustrated in FIG. 17, the system 100 can include one or more computing device(s) 102 and one or more user and/or network device(s). The computing device 102 includes processing circuitry comprising at least one processor circuit, for example, having a processor and a memory 112. Stored in the memory 112 can be both data and several components that are executable by the processor. In particular, stored in the memory 112 and executable by the processor can be one or more image reconstruction application(s) and potentially other applications. Image reconstruction can refer to 2D or 3D image reconstruction as previously described, or other imaging applications. Also stored in the memory 112 may be a data store and other data. The data stored in the data store, for example, is associated with the operation of the various applications and/or functional entities described below. In addition, an operating system may be stored in the memory 112 and executable by the processor. The data store may be may be located in a single computing device or may be dispersed among many different devices. Also, the computing device 102 may comprise multiple processors and the memory 112 may represent multiple memories 112 that operate in parallel processing circuits, respectively.

It is understood that there may be other applications that are stored in the memory 112 and are executable by the processor 709 as can be appreciated. Where any component discussed herein is implemented in the form of software, any one of a number of programming languages may be employed such as, for example, C, C++, C#, Objective C, Java, Java Script, Perl, PHP, Visual Basic, Python, Ruby, Delphi, Flash, or other programming languages. A number of software components can be stored in the memory 112 that are executable by the processor. In this respect, the term "executable" means a program file that is in a form that can ultimately be run by the processor. Examples of executable programs may be, for example, a compiled program that can be translated into machine code in a format that can be loaded into a random access portion of the memory 112 and run by the processor, source code that may be expressed in proper format such as object code that is capable of being loaded into a random access portion of the memory 112 and executed by the processor, or source code that may be interpreted by another executable program to generate instructions in a random access portion of the memory 112 to be executed by the processor, etc. An executable program may be stored in any portion or component of the memory 112 including, for example, random access memory (RAM), read-only memory (ROM), hard drive, solid-state drive, USB flash drive, memory card, optical disc such as compact disc (CD) or digital versatile disc (DVD), floppy disk, magnetic tape, or other memory components.

The memory 112 is defined herein as including both volatile and nonvolatile memory and data storage components. Volatile components are those that do not retain data values upon loss of power. Nonvolatile components are those that retain data upon a loss of power. Thus, the memory 112 may comprise, for example, random access memory (RAM), read-only memory (ROM), hard disk drives, solid-state drives, USB flash drives, memory cards accessed via a memory card reader, floppy disks accessed via an associated floppy disk drive, optical discs accessed via an optical disc drive, magnetic tapes accessed via an appropriate tape drive, and/or other memory components, or a combination of any two or more of these memory components. In addition, the RAM may comprise, for example, static random access memory (SRAM), dynamic random access memory (DRAM), or magnetic random access memory (MRAM) and other such devices. The ROM may comprise, for example, a programmable read-only memory (PROM), an erasable programmable read-only memory (EPROM), an electrically erasable programmable read-only memory (EEPROM), or other like memory device.

Also, any logic or application described herein, including one or more image reconstruction application(s), that comprises software or code can be embodied in any non-transitory computer-readable medium for use by or in connection with an instruction execution system such as, for example, a processor 709 in a computer system or other system. In this sense, the logic may comprise, for example, statements including instructions and declarations that can be fetched from the computer-readable medium and executed by the instruction execution system. In the context of the present disclosure, a "computer-readable medium" can be any medium that can contain, store, or maintain the logic or application described herein for use by or in connection with the instruction execution system.

Although one or more image reconstruction application(s), and other various systems described herein, may be embodied in software or code executed by general purpose hardware as discussed above, as an alternative the same may also be embodied in dedicated hardware or a combination of software/general purpose hardware and dedicated hardware. If embodied in dedicated hardware, each can be implemented as a circuit or state machine that employs any one of or a combination of a number of technologies. These technologies may include, but are not limited to, discrete logic circuits having logic gates for implementing various logic functions upon an application of one or more data signal(s), application specific integrated circuits having appropriate logic gates, or other components, etc. Such technologies are generally well known by those skilled in the art and, consequently, are not described in detail herein.

Figure 18:
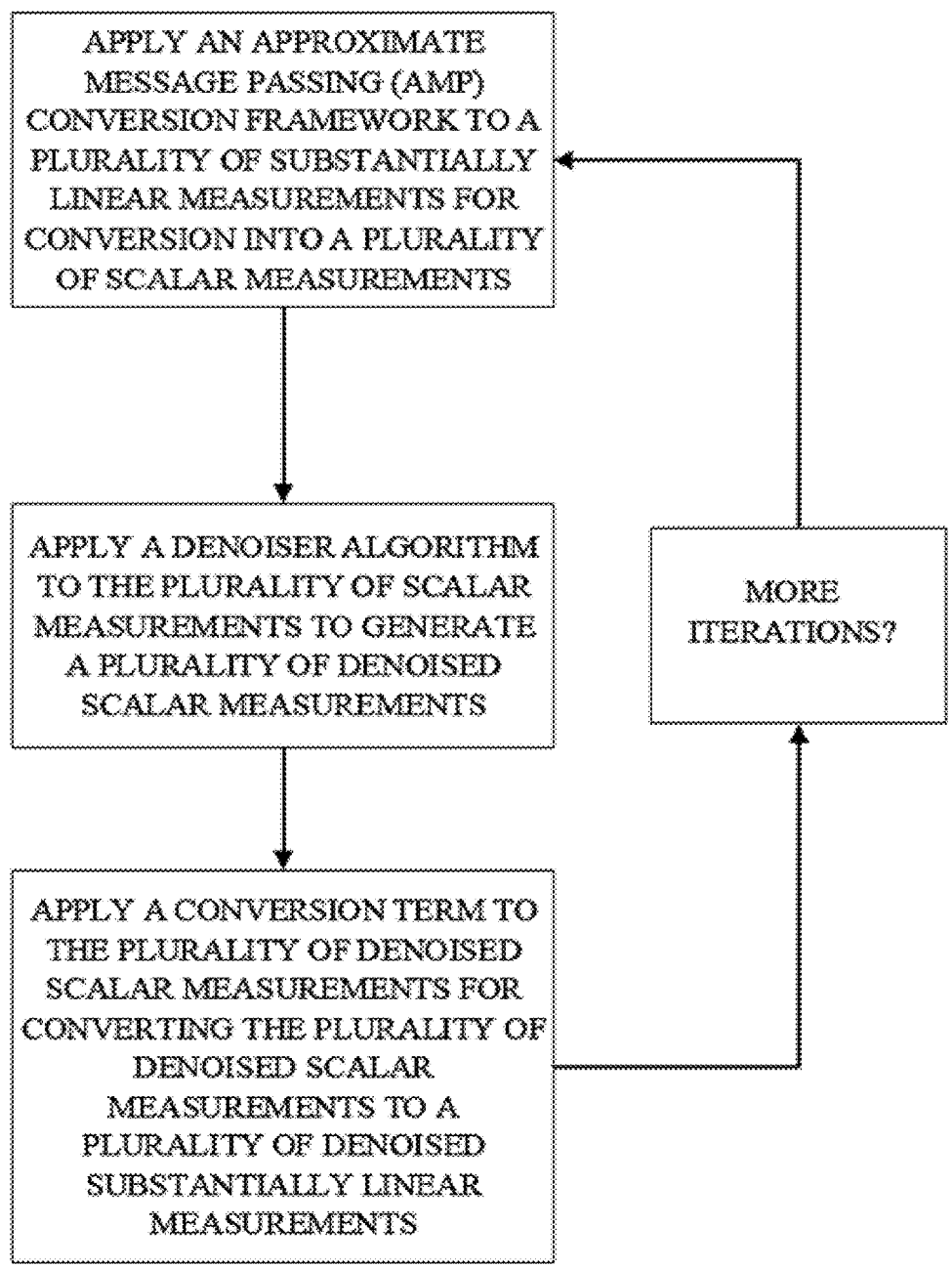
FIG. 18 is a flowchart of an example of compressive imaging using approximate message passing with denoising in accordance with various embodiments of the present disclosure.

FIG. 18 is an example of a flowchart of an example method for compressive imaging using approximate message passing (AMP) with denoising in accordance with embodiments of the present invention. The method includes using at least one processor and memory. The method includes applying an approximate message passing (AMP) conversion framework to a plurality of substantially linear measurements for conversion into a plurality of scalar measurements. The method further includes applying a denoiser algorithm to the plurality of scalar measurements to generate a plurality of denoised scalar measurements. Further, the method includes applying a conversion term to the plurality of denoised scalar measurements for converting the plurality of denoised scalar measurements to a plurality of denoised substantially linear measurements.

With continued reference to FIG. 18, AMP is an iterative signal reconstruction algorithm that performs scalar denoising within each iteration and proper selection of the denoising function used within AMP should be applied to obtain desirable reconstruction quality. There are several classes of image denoisers including wavelet-based methods and dictionary learning methods. A wavelet-based image denoiser can proceed by applying a wavelet transform to the image and obtain wavelet coefficients. The wavelet-based image denoiser then denoises the wavelet coefficients. Then the wavelet-based image denoiser applies an inverse wavelet transform to the denoised wavelet coefficients resulting in a denoised image. Two examples of which may be applied to wavelet coefficients are amplitude-scale invariant Bayes estimator and adaptive Wiener filter. The number of iterations is configurable and may be either manually or programmatically determined.

The flowchart of FIG. 18 shows an example of functionality and operation of an implementation of portions of an image reconstruction application. If embodied in software, each block may represent a module, segment, or portion of code that comprises program instructions to implement the specified logical function(s). The program instructions may be embodied in the form of source code that comprises human-readable statements written in a programming language or machine code that comprises numerical instructions recognizable by a suitable execution system such as a processor in a computing device 102 or other system. The machine code may be converted from the source code, etc. If embodied in hardware, each block may represent a circuit or a number of interconnected circuits to implement the specified logical function(s). Although the flowchart of FIG. 18 shows a specific order of execution, it is understood that the order of execution may differ from that which is depicted. For example, the order of execution of two or more blocks may be scrambled relative to the order shown. Also, two or more blocks shown in succession may be executed concurrently or with partial concurrence. Further, in some embodiments, one or more of the blocks shown in FIG. 18 may be skipped or omitted.

It should be emphasized that the above-described embodiments of the present disclosure are merely possible examples of implementations set forth for a clear understanding of the principles of the disclosure. Many variations and modifications may be made to the above-described embodiment(s) without departing substantially from the spirit and principles of the disclosure. All such modifications and variations are intended to be included herein within the scope of this disclosure and protected by the following claims.

It should be noted that ratios, concentrations, amounts, and other numerical data may be expressed herein in a range format. It is to be understood that such a range format is used for convenience and brevity, and thus, should be interpreted in a flexible manner to include not only the numerical values explicitly recited as the limits of the range, but also to include all the individual numerical values or sub-ranges encompassed within that range as if each numerical value and sub-range is explicitly recited. To illustrate, a concentration range of "about 0.1% to about 5%" should be interpreted to include not only the explicitly recited concentration of about 0.1 wt % to about 5 wt %, but also include individual concentrations (e.g., 1%, 2%, 3%, and 4%) and the sub-ranges (e.g., 0.5%, 1.1%, 2.2%, 3.3%, and 4.4%) within the indicated range. The term "about" can include traditional rounding according to significant figures of numerical values. In addition, the phrase "about 'x' to 'y'" includes "about 'x' to about 'y'".

Therefore, at least the following is claimed:

1. A method, comprising:
applying, using processing circuitry including a processor and memory, an approximate message passing (AMP) conversion framework to a plurality of substantially linear measurements of a multi-dimensional signal for conversion into a plurality of scalar measurements, where the multi-dimensional signal comprises a two-dimensional image or a three-dimensional hyper spectral image or volume;
applying, using the processing circuitry, a non-scalar denoiser algorithm to the plurality of scalar measurements to generate a plurality of denoised scalar measurements; and
applying, using the processing circuitry, a conversion term to the plurality of denoised scalar measurements for converting the plurality of denoised scalar measurements to a plurality of denoised substantially linear measurements.

2. The method of claim 1, wherein the non-scalar denoiser algorithm is a dictionary learning based image denoiser.

3. The method of claim 2, wherein the dictionary learning based image denoiser is a sparsity based simultaneous denoising and interpolation (SBSDI) algorithm.

4. The method of claim 1, wherein a two-dimensional signal is denoised using a block-matching and 3-D filtering (BM3D) algorithm.

5. The method of claim 1, wherein the plurality of substantially linear measurements represents a three-dimensional signal and the applied non-scalar denoiser algorithm is a block matching 4-D (BM4D) filtering image denoiser algorithm.

6. The method of claim 1, wherein the non-scalar denoiser algorithm uses an adaptive Wiener filter wavelet-based denoiser.

7. The method of claim 6, further comprising damping to convert the plurality of substantially linear measurements.

8. The method of claim 1, wherein the denoiser algorithm is optimized for p-norm errors.

9. A method, comprising:
applying, using processing circuitry including a processor and memory, an approximate message passing (AMP) conversion framework to a plurality of substantially linear measurements for conversion into a plurality of scalar measurements, wherein the plurality of substantially linear measurements represents a three-dimensional signal that corresponds to a hyperspectral image;
applying, using the processing circuitry, a denoiser algorithm to the plurality of scalar measurements to generate a plurality of denoised scalar measurements; and
applying, using the processing circuitry, a conversion term to the plurality of denoised scalar measurements for converting the plurality of denoised scalar measurements to a plurality of denoised substantially linear measurements.

10. The method of claim 9, wherein the applied denoiser algorithm is a block matching 4-D (BM4D) filtering image denoiser algorithm.

11. A method, comprising:
applying, using processing circuitry including a processor and memory, an approximate message passing (AMP) conversion framework to a plurality of substantially linear measurements for conversion into a plurality of scalar measurements;
applying, using the processing circuitry, a denoiser algorithm to the plurality of scalar measurements to generate a plurality of denoised scalar measurements, wherein the denoiser algorithm is a three-dimensional denoiser algorithm that applies a two-dimensional wavelet-based and one-dimensional discrete cosine transform prior to denoising; and
applying, using the processing circuitry, a conversion term to the plurality of denoised scalar measurements for converting the plurality of denoised scalar measurements to a plurality of denoised substantially linear measurements.

12. The method of claim 11, wherein the three-dimensional denoiser algorithm is an adaptive Wiener filter configured for wavelet coefficients having a non-zero mean.

13. The method of claim 12, further comprising damping to convert the plurality of substantially linear measurements.

14. A method, comprising:
applying, using processing circuitry including a processor and memory, an approximate message passing (AMP)

conversion framework to a plurality of substantially linear measurements for conversion into a plurality of scalar measurements;

applying, using the processing circuitry, a denoiser algorithm to the plurality of scalar measurements to generate a plurality of denoised scalar measurements; and applying, using the processing circuitry, a conversion term to the plurality of denoised scalar measurements for converting the plurality of denoised scalar measurements to a plurality of denoised substantially linear measurements, wherein an Onsager correction term portion of the conversion term is approximated.

* * * * *